US011923861B1

(12) United States Patent
Liu et al.

(10) Patent No.: US 11,923,861 B1
(45) Date of Patent: Mar. 5, 2024

(54) WIDEBAND RAIL-TO-RAIL VOLTAGE CONTROLLED OSCILLATOR

(71) Applicant: QUALCOMM Incorporated, San Diego, CA (US)

(72) Inventors: Hao Liu, San Diego, CA (US); Lejie Lu, San Diego, CA (US); Yu Song, San Diego, CA (US); Dong Ren, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 18/164,211

(22) Filed: Feb. 3, 2023

(51) Int. Cl.
*H03L 7/099* (2006.01)
*H03L 7/089* (2006.01)
*H03L 7/091* (2006.01)

(52) U.S. Cl.
CPC .......... *H03L 7/0995* (2013.01); *H03L 7/0891* (2013.01); *H03L 7/091* (2013.01)

(58) Field of Classification Search
CPC ...... H03L 7/0995; H03L 7/0891; H03L 7/091
See application file for complete search history.

(56) References Cited

U.S. PATENT DOCUMENTS

| | | | | |
|---|---|---|---|---|
| 5,239,274 A * | 8/1993 | Chi | ........................ | H03B 27/00 331/177 R |
| 5,300,898 A * | 4/1994 | Chen | ................ | H03K 19/01721 331/177 R |
| 6,246,294 B1 * | 6/2001 | Gai | ........................... | H03L 7/18 331/25 |
| 6,496,470 B2 * | 12/2002 | Hayashi | ................ | H03L 7/0995 369/124.05 |
| 7,286,811 B2 * | 10/2007 | Kral | ..................... | H03D 7/1441 455/340 |
| 10,333,530 B1 * | 6/2019 | Katsuragi | ............... | H03L 7/093 |
| 10,998,910 B1 * | 5/2021 | Rosen | ................... | H03L 7/0996 |
| 11,342,927 B1 * | 5/2022 | Lim | ..................... | H03K 23/667 |
| 11,764,762 B1 * | 9/2023 | Xiong | .................... | H03K 3/354 331/57 |
| 2006/0091967 A1 * | 5/2006 | Iozsef | ............. | H03K 17/04106 331/57 |
| 2009/0174486 A1 * | 7/2009 | Haralabidis | ........... | H03B 21/01 331/45 |

(Continued)

FOREIGN PATENT DOCUMENTS

WO WO-2011002944 A1 * 1/2011 ............. H03L 7/085

*Primary Examiner* — Adam D Houston
(74) *Attorney, Agent, or Firm* — Loza & Loza, LLP

(57) ABSTRACT

A voltage controlled oscillator (VCO), including: at least one second upper voltage rail; at least one second lower voltage rail; a ring of N cascaded inverters, wherein the set of N cascaded inverters are coupled between the at least one second upper voltage rail and the at least one second lower voltage rail; at least one first frequency band select circuit coupled between first upper voltage rail and the at least one second upper voltage rail; at least one second frequency band select circuit coupled between the at least one second lower voltage rail and first lower voltage rail; at least one first VCO frequency control circuit coupled between the first upper voltage rail and the at least one second upper voltage rail; and at least one second VCO frequency control circuit coupled between the at least one second lower voltage rail and the first lower voltage rail.

30 Claims, 8 Drawing Sheets

(56) References Cited

U.S. PATENT DOCUMENTS

| | | | | |
|---|---|---|---|---|
| 2010/0134170 | A1* | 6/2010 | Wang | H03K 3/0322 |
| | | | | 327/288 |
| 2014/0266343 | A1* | 9/2014 | Song | H03L 7/0802 |
| | | | | 327/157 |
| 2015/0318978 | A1* | 11/2015 | Song | H04L 7/0016 |
| | | | | 375/371 |
| 2019/0056274 | A1* | 2/2019 | Fan | H03K 3/0315 |
| 2022/0221507 | A1* | 7/2022 | Sutaria | G01R 31/2884 |
| 2022/0286121 | A1* | 9/2022 | Fertsch | H03K 19/00384 |
| 2022/0294479 | A1* | 9/2022 | Chakraborty | H04B 1/04 |
| 2023/0105664 | A1* | 4/2023 | Zhang | H03F 3/45475 |
| | | | | 455/73 |

* cited by examiner

US 11,923,861 B1

WIDEBAND RAIL-TO-RAIL VOLTAGE CONTROLLED OSCILLATOR

FIELD

Aspects of the present disclosure relate generally to oscillators, and in particular, to a wideband rail-to-rail voltage controlled oscillator (VCO).

BACKGROUND

Phase lock loops (PLLs) are configured to generate substantially periodic oscillating (clock) signals for use in various signal processing applications, such as clock and data recovery (CDR) as an example. In some applications, there may be a need for various PLLs to generate clock signals with frequencies spanning different frequency bands. However, an integrated circuit (IC) implementing a set of PLLs for different frequency band applications typically is not that desirable because of the impact to IC footprint, power consumption, and complexity in the control of the PLLs.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus, includes: a first upper voltage rail; a first lower voltage rail; and a voltage controlled oscillator (VCO), including: at least one second upper voltage rail; at least one second lower voltage rail; a ring oscillator (RO) including a set of N cascaded inverters arranged in a ring, wherein the set of N cascaded inverters are coupled between the at least one second upper voltage rail and the at least one second lower voltage rail, wherein N is a positive integer number; at least one first frequency band select circuit coupled between the first upper voltage rail and the at least one second upper voltage rail, respectively; at least one second frequency band select circuit coupled between the at least one second lower voltage rail and the first lower voltage rail, respectively; at least one first VCO frequency control circuit coupled between the first upper voltage rail and the at least one second upper voltage rail, respectively; and at least one second VCO frequency control circuit coupled between the at least one second lower voltage rail and the first lower voltage rail, respectively.

Another aspect of the disclosure relates to a method of generating a voltage controlled oscillator (VCO) clock signal. The method includes supplying current from a first upper voltage rail to a ring oscillator via at least one second upper voltage rail based on a frequency band select signal and a PLL frequency control signal, wherein the ring oscillator is configured to generate the VCO clock signal whose frequency varies with the frequency band select signal and the PLL frequency control signal; and sinking current from the ring oscillator to a first lower supply voltage rail via at least one second lower voltage rail based on the frequency band select signal and the PLL frequency control signal.

Another aspect of the disclosure relates to an apparatus for generating a voltage controlled oscillator (VCO) clock signal. The apparatus includes means for supplying current from a first upper voltage rail to a ring oscillator via at least one second upper voltage rail based on a frequency band select signal and a PLL frequency control signal, wherein the ring oscillator is configured to generate the VCO clock signal whose frequency varies with the frequency band select signal and the PLL frequency control signal; and means for sinking current from the ring oscillator to a first lower supply voltage rail via at least one second lower voltage rail based on the frequency band select signal and the PLL frequency control signal.

Another aspect of the disclosure relates to a wireless communication device. The wireless communication device includes: at least one antenna; a transceiver coupled to the at least one antenna; an integrated circuit (IC) coupled to the transceiver, wherein the IC includes one or more signal processing cores, and wherein at least one of the IC or the transceiver each includes: a first upper voltage rail; a first lower voltage rail; and a voltage controlled oscillator (VCO), including: at least one second upper voltage rail; at least one second lower voltage rail; a ring oscillator (RO) including a set of N cascaded inverters arranged in a ring, wherein the set of N cascaded inverters are coupled between the at least one second upper voltage rail and the at least one second lower voltage rail, wherein N is a positive integer number; at least one first frequency band select circuit coupled between the first upper voltage rail and the at least one second upper voltage rail, respectively; at least one second frequency band select circuit coupled between the at least one second lower voltage rail and the first lower voltage rail, respectively; at least one first VCO frequency control circuit coupled between the first upper voltage rail and the at least one second upper voltage rail, respectively; and at least one second VCO frequency control circuit coupled between the at least one second lower voltage rail and the first lower voltage rail, respectively.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

As discussed, phase lock loops (PLLs) are configured to generate substantially periodic oscillating (clock) signals for use in various signal processing applications, such as clock and data recovery (CDR) and others. In some applications, such as Peripheral Component Interconnect (PCI) CDR applications, there may be a need for various PLLs to generate clock signals with frequencies spanning different frequency bands. For example, if PCI version 1.1 (PCI-1.1) protocol for data transfer is used, then a CDR with a PLL may be employed to generate a clock signal with frequency of up to 1.25 giga Hertz (GHz). If PCI-3.1 protocol for data transfer is used, then a CDR with a PLL may be employed to generate a clock signal with frequency of up to four (4) GHz. If PCI-5.0 protocol for data transfer is used, then a CDR with a PLL may be employed to generate a clock signal with frequency of up to 16 GHz.

Figure 1:
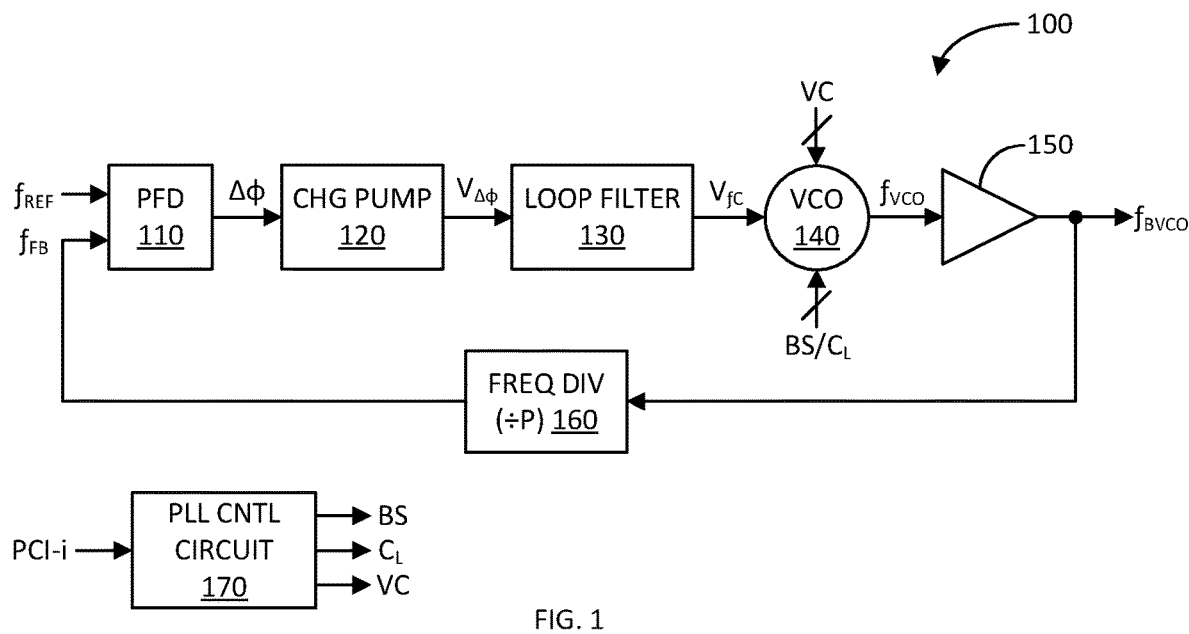
FIG. 1 illustrates a block diagram of an example phase lock loop (PLL) in accordance with an aspect of the disclosure.

FIG. 1 illustrates a block diagram of an example phase lock loop (PLL) 100 in accordance with an aspect of the disclosure. The PLL 100 may be an example of a wideband PLL configured to selectively or controllably generate a clock signal with frequencies, for example, between 1.25 GHz to 16 GHz. In particular, the PLL 100 includes a phase-frequency detector (PFD) 110, a charge pump 120, a loop filter 130, a voltage controlled oscillator (VCO) 140, a buffer 150, and a frequency divider 160. Additionally, the PLL 100 may include a PLL control circuit 170 for controlling the operations of the PLL 100, as discussed further herein.

The PFD 110 is configured to receive a reference clock signal $f_{REF}$ and a feedback clock signal $f_{FB}$, and generate a signal $\Delta\phi$ based on a phase/frequency difference between the signals $f_{REF}$ and $f_{FB}$. The charge pump 120 is configured to generate a control voltage or signal $V_{\Delta\phi}$ based on the phase difference signal $\Delta\phi$. The loop filter 130 is configured to low pass filter (LPF) the control signal $V_{\Delta\phi}$ to generate a PLL frequency control signal $V_{fC}$. As discussed in more detail further herein, the VCO 140 is configured to generate a VCO clock signal $f_{VCO}$ based on the PLL frequency control signal $V_{fC}$, a kvco control (VC) signal, a band select (BS) signal, and a signal $C_L$ for controlling a capacitance of each of a set of variable load capacitors internal to the VCO 140.

The buffer 150 is configured to buffer the output of the VCO 140 (e.g., at which the VCO clock signal $f_{VCO}$ is generated), and generate a buffered VCO clock signal $f_{BVCO}$. For example, the buffer 150 may be configured to correct the skew in the VCO clock signal $f_{VCO}$ to generate the buffered VCO clock signal $f_{BVCO}$ with substantially 50 percent (%) duty cycle. The frequency divider 160 may be configured to frequency divide the buffered VCO clock signal $f_{BVCO}$ by an integer or fractional divider ratio (P) to generate the feedback clock signal $f_{FB}$. When the PLL 100 is phase/frequency locked, the VCO clock signal $f_{VCO}$ and the buffered VCO clock signal $f_{BVCO}$ has a frequency P times the frequency of the reference clock signal $f_{REF}$.

The PLL control circuit 170 may be configured to receive an input control signal, such as, for example, a PCI-i signal for selecting the protocol "i" (e.g., i=1.1 to 5.0), for setting the frequency of the VCO clock signal $f_{VCO}$ suitable for the selected protocol PCI-i. Accordingly, the PLL control circuit 170 is configured to generate output control signals BS, $C_L$, and VC for controlling the VCO 140 in generating of the VCO clock signal $f_{VCO}$ based on the input control signal PCI-i. As discussed in more detail herein, the BS and $C_L$ control signals configure the VCO 140 to operate within certain defined frequency ranges (e.g., ~1.25 GHz if PCI-i signal indicates i=1.1; ~4 GHz if PCI-i signal indicates i=3.1; and ~16 GHz if PCI-i signal indicates i=5.0). The VC control signal sets the kvco factor of the VCO 140, where the frequency of the VCO clock signal $f_{VCO}$ may be equal or related to kvco multiplied by the PLL frequency control signal $V_{fC}$.

Figure 2:
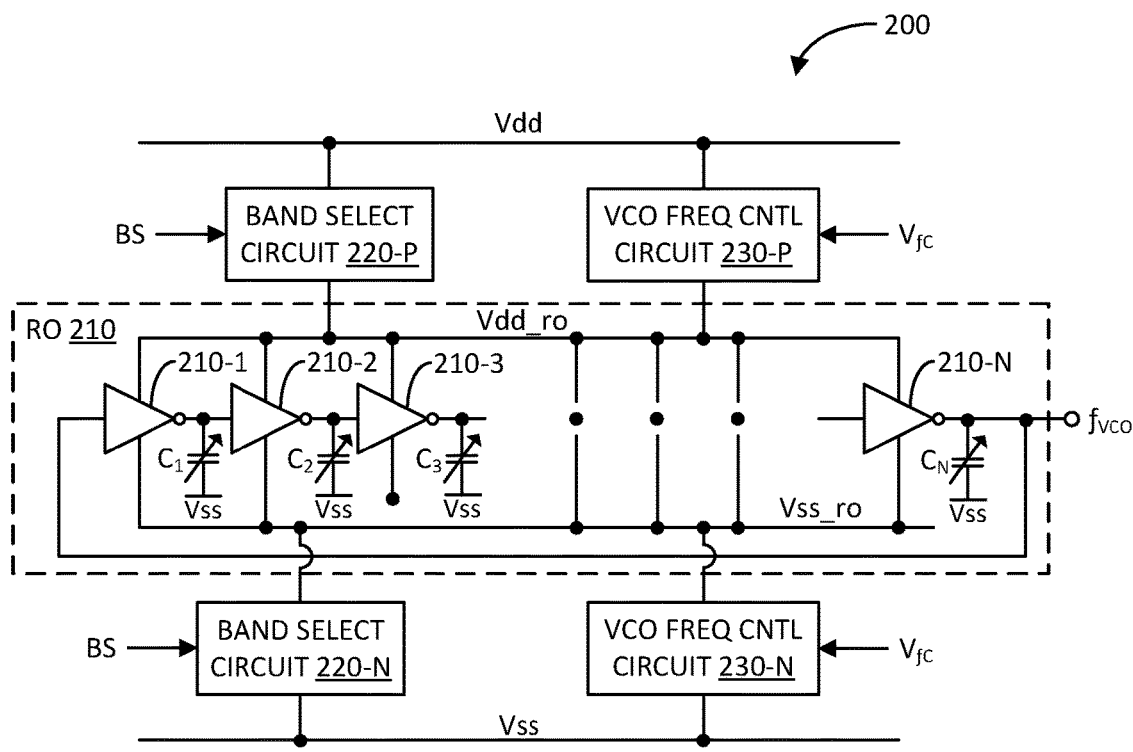
FIG. 2 illustrates a block/schematic diagram of an example voltage controlled oscillator (VCO) in accordance with another aspect of the disclosure.

FIG. 2 illustrates a block/schematic diagram of an example voltage controlled oscillator (VCO) 200 in accordance with another aspect of the disclosure. The VCO 200 may be an example more detailed implementation of the VCO 140 of PLL 100. In particular, the VCO 200 includes a ring oscillator (RO) 210, a first band select circuit 220-P, a second band select circuit 220-N, a first VCO frequency control circuit 230-P, and a second VCO frequency control circuit 230-N.

The RO 210 includes a set of N cascaded inverters 210-1 to 210-N arranged in a ring (where N is a positive integer number). That is, the inverters 210-1 to 210-N include outputs coupled to inputs of inverters 210-2 to 210-N and to 210-1, respectively. The set of inverters 210-1 to 210-N are coupled between a local upper voltage rail Vdd_ro and a local lower voltage rail Vss_ro. The RO 210 may further include a set of load capacitors $C_1$ to $C_N$, each of which may have a programmable or variable capacitance, coupled between the outputs of the set of inverters 210-1 to 210-N and a more global lower voltage rail Vss (e.g., ground), respectively.

The first band select circuit 220-P may be coupled between a more global upper voltage rail Vdd and the RO local upper voltage rail Vdd_ro. As discussed in more detail further herein, the first band select circuit 220-P is configured to supply current from the global upper voltage rail Vdd to the RO 210 via the local upper voltage rail Vdd_ro based on the band select control signal BS generated by the PLL control circuit 170. In this regard, the more current supplied to the RO 210, the greater speed at which the RO 210 operates, and higher the frequency of the VCO clock signal $f_{VCO}$ generated by the RO 210; and vice-versa. Accordingly, the RO 210 may be operated in different frequency bands based on the BS control signal.

Similarly, the second band select circuit 220-N may be coupled between the RO local lower voltage rail Vss_ro and the global lower voltage rail Vss. As discussed in more detail further herein, the second band select circuit 220-N is configured to sink current from the RO 210 to the global lower voltage rail Vss via the local lower voltage rail Vss_ro based on the band select control signal BS generated by the PLL control circuit 170. In this regard, the more current sunk from the RO 210, the greater speed at which the RO 210 operates, and higher the frequency of the VCO clock signal $f_{VCO}$ generated by the RO 210; and vice-versa. Accordingly, the RO 210 may be operated in different frequency bands based on the BS control signal.

In conjunction with the BS control signal, the $C_L$ control signal generated by the PLL control circuit 170 may also be used to set the operating frequency band of the RO 210. For example, the speed at which the RO 210 operates is inversely related to the capacitance of each of the set of capacitors $C_1$ to $C_N$, respectively. Thus, if the RO 210 is to be operated in a relatively high frequency band, the $C_L$ control signal sets the capacitance of each of the set of capacitors $C_1$ to $C_N$ to relatively low or decouples the capacitors $C_1$ to $C_N$ from the inverters 210-1 to 210-N, respectively. Conversely, if the RO 210 is to be operated in a relatively low frequency band, the $C_L$ control signal sets the capacitance of each of the set of capacitors $C_1$ to $C_N$ to relatively high.

The first VCO frequency control circuit 230-P may also be coupled between the global upper voltage rail Vdd and the RO local upper voltage rail Vdd_ro. As discussed in more detail further herein, the first VCO frequency control circuit 230-P is configured to supply current from the global upper voltage rail Vdd to the RO 210 via the local upper voltage rail Vdd_ro based on the PLL frequency control signal $V_{fC}$. In this regard, the more current supplied to the RO 210, the greater speed at which the RO 210 operates, and higher the frequency of the VCO clock signal $f_{VCO}$ generated by the RO 210. The first VCO frequency control circuit 230-P may provide a finer frequency control of the VCO clock signal $f_{VCO}$ to maintain PLL 100 locked. Whereas, the first band select circuit 220-P may provide a coarser frequency control of the VCO clock signal $f_{VCO}$ to set the operating frequency range of the VCO 200.

Similarly, the VCO frequency control circuit 230-N may be coupled between the RO local lower voltage rail Vss_ro and the global lower voltage rail Vss. As discussed in more detail further herein, the second VCO frequency control circuit 230-N is configured to sink current from the RO 210 to the global lower voltage rail Vss via the local lower voltage rail Vss_ro based on the PLL frequency control signal $V_{fC}$. In this regard, the more current sunk from the RO 210, the greater speed at which the RO 210 operates, and higher the frequency of the VCO clock signal $f_{VCO}$ generated by the RO 210. Similarly, the second VCO frequency control circuit 230-N may provide a finer frequency control of the VCO clock signal $f_{VCO}$ to maintain PLL 100 locked. Whereas, the second band select circuit 220-N may provide a coarser frequency control of the VCO clock signal $f_{VCO}$ to set the operating frequency range of the VCO 200.

Figure 3:
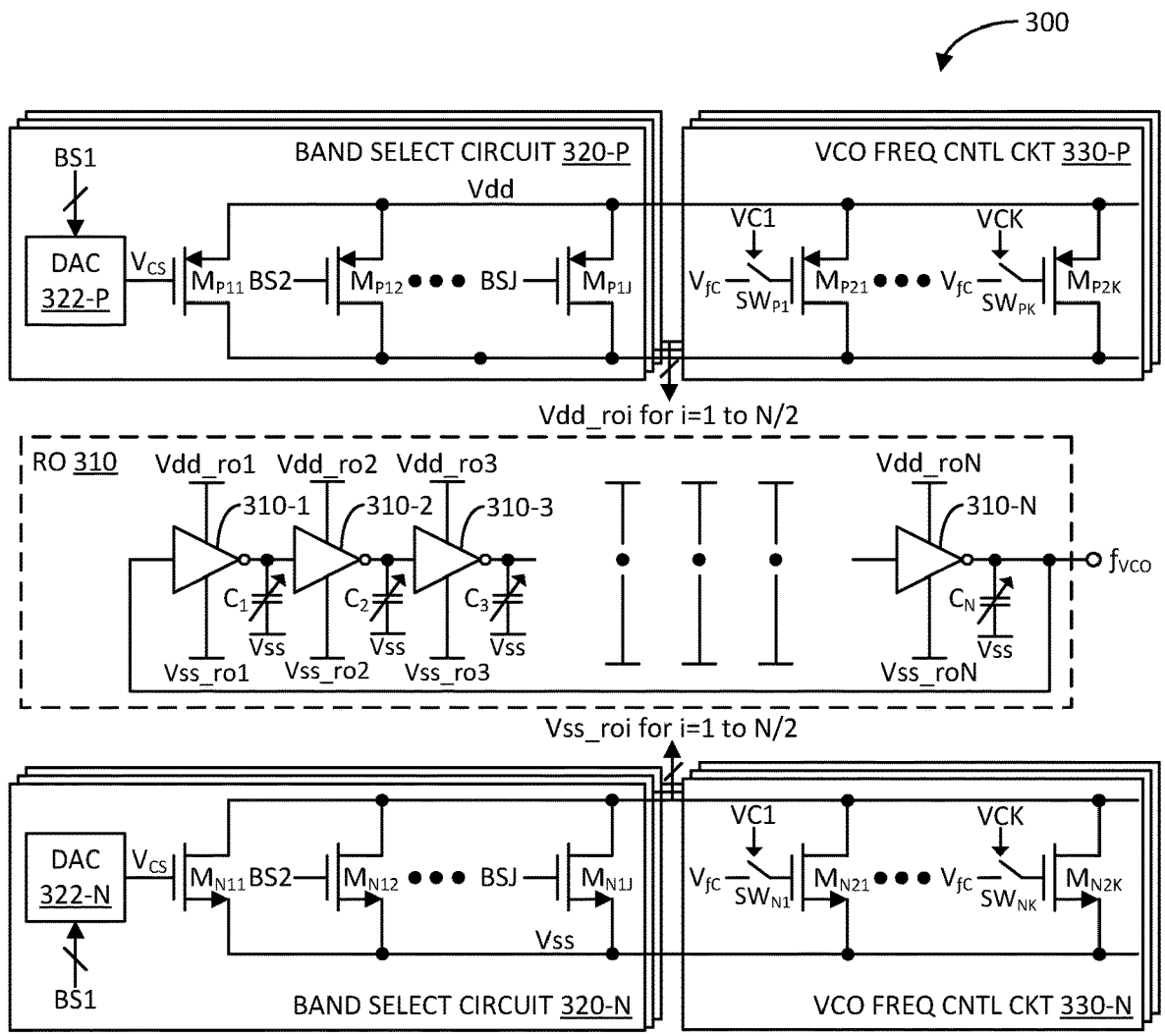
FIG. 3 illustrates a schematic diagram of another example voltage controlled oscillator (VCO) in accordance with another aspect of the disclosure.

FIG. 3 illustrates a schematic diagram of another example voltage controlled oscillator (VCO) 300 in accordance with another aspect of the disclosure. The VCO 300 may be an example more detailed implementation of the VCO 200 previously discussed. In particular, the VCO 300 includes a ring oscillator (RO) 310, a first band select circuit 320-P, a second band select circuit 320-N, a first VCO frequency control circuit 330-P, and a second VCO frequency control circuit 330-N.

The RO 310 includes a set of cascaded inverters 310-1 to 310-N arranged in a ring (where N is a positive integer number). That is, the inverters 310-1 to 310-N include outputs coupled to inputs of inverters 310-2 to 310-N and to 310-1, respectively. The set of inverters 310-1 to 310-N are coupled between at least one local upper voltage rail Vdd_ro (e.g., Vdd_ro1 to Vdd_roN/2) and at least one local lower voltage rail Vss_ro (e.g., Vss_ro1 to Vss_roN/2). For example, to reduce or substantially isolate switching noise between inverters 310-1 to 310-N, each pair of inverters 310-$i$/310-($i$+N/2) is coupled between local upper and lower voltage rails Vdd_roi and Vss_roi for i=1 to N/2. The RO 310 may further include a set of load capacitors $C_1$ to $C_N$, each of which may have a programmable or variable capacitance, coupled between the outputs of the set of inverters 310-1 to 310-N and a more global lower voltage rail Vss (e.g., ground), respectively.

The first band select circuit 320-P may be coupled between a more global upper voltage rail Vdd and at least one the RO local upper voltage rail Vdd_ro. For example, the first band select circuit 320-P may include N/2 slices or instantiations coupled between the global upper voltage rail Vdd and local upper voltage rails Vdd_ro1 to Vdd_roN/2, respectively. As discussed in more detail further herein, the first band select circuit 320-P is configured to supply current from the global upper voltage rail Vdd to the RO 310 via the at least one local upper voltage rail Vdd_ro based on the band select control signal BS generated by the PLL control circuit 170. In this regard, the more current supplied to that the RO 310, the greater speed at which the RO 310 operates, and higher the frequency of the VCO clock signal $f_{VCO}$ generated by the RO 310; and vice-versa. Accordingly, the RO 310 may be operated in different frequency bands based on the BS control signal.

More specifically, the first band select circuit 320-P includes a digital-to-analog converter (DAC) 322-P, and a set of field effect transistors (FETs) $M_{P11}$ to $M_{P1J}$ (each of which may be implemented as a p-channel metal oxide semiconductor FET or PMOS FET), where J may be an integer number. The DAC 322-P is configured to receive a first digital component BS1 of the BS control signal, and generate an analog current source control signal $V_{CS}$ based on the BS1 digital control signal. The set of PMOS FETs $M_{P11}$ to $M_{P1J}$ are coupled between the global upper voltage rail Vdd and the at least one RO local upper voltage rail Vdd_ro. That is, each of the set of PMOS FETs $M_{P11}$ to $M_{P1J}$ includes a source coupled to the global upper voltage rail Vdd and a drain coupled to the at least one RO local upper voltage rail Vdd_ro.

The PMOS FET $M_{P11}$ includes a gate configured to receive the analog current source control signal $V_{CS}$. The PMOS FETs $M_{P12}$ to $M_{P1J}$ include gates configured to receive other digital components BS2 to BSJ of the BS control signal, respectively. The BS1 control signal operates the PMOS FET $M_{P11}$ as a current source, and the BS2 to BSJ control signals operate the PMOS FETs $M_{P12}$ to $M_{P1J}$ as switching devices.

In operation, for high frequency range operation of the RO 310 (e.g., 8-16 GHz), one or more of the PMOS FETs $M_{P12}$ to $M_{P1J}$ are turned on to strongly couple the global upper voltage rail Vdd to the at least one local upper voltage rail Vdd_ro to supply a relatively large current to the RO 310 so that the RO 310 generates a VCO clock signal with a frequency within one of the high frequency ranges depending on how many of the PMOS FETs $M_{P12}$ to $M_{P1J}$ are turned on (e.g., more turned on, higher operating frequency range; and vice-versa). In such high frequency range configuration, the resistance of the current source PMOS FET $M_{P11}$ is significantly high compared to the turned-on resistance of the PMOS FETs $M_{P12}$ to $M_{P1J}$, such that the PMOS FET $M_{P11}$ may not have any effects on the selection of the high frequency range for the RO 310.

For low frequency range operation of the RO 310 (e.g., 1.25-8 GHz), the PMOS FETs $M_{P12}$ to $M_{P1J}$ are all turned off, and the PMOS FET $M_{P11}$ is operated as a current source in accordance with the control signal BS1 to supply a relatively low current to the RO 310 so that the RO 310 generates a VCO clock signal with a frequency within one of the low frequency ranges (e.g., more current, higher operating frequency range; and vice-versa).

Similarly, the second band select circuit 320-N may be coupled between the at least one RO local lower voltage rail Vss_ro and the global lower voltage rail Vss. For example, the second band select circuit 320-N may include N/2 slices or instantiations coupled between local lower voltage rails Vss_ro1 to Vss_roN/2 and the global lower voltage rail Vss, respectively. As discussed in more detail further herein, the second band select circuit 320-N is configured to sink current from the RO 310 to the global lower voltage rail Vss via the at least one local lower voltage rail Vss_ro based on the band select control signal BS generated by the PLL control circuit 170. In this regard, the more current sunk from the RO 310, the greater speed at which the RO 310 operates, and higher the frequency of the VCO clock signal $f_{VCO}$ generated by the RO 310. Accordingly, the RO 310 may be operated in different frequency bands based on the BS control signal.

More specifically, the second band select circuit 320-N includes a DAC 322-N, and a set of FETs $M_{N11}$ to $M_{N1J}$ (each of which may be implemented as an n-channel metal oxide semiconductor FET or NMOS FET). The DAC 322-N is configured to receive the first digital component BS1 of the BS control signal, and generate the analog current source control signal $V_{CS}$ based on the BS1 digital control signal. The set of NMOS FETs $M_{N11}$ to $M_{N1J}$ are coupled between the at least one RO local upper voltage rail Vdd_ro and the global lower voltage rail Vss. That is, each of the set of NMOS FETs $M_{N11}$ to $M_{N1J}$ includes a drain coupled to the at least one local lower voltage rail Vss_ro and a source coupled to the global lower voltage rail Vss.

The NMOS FET $M_{N11}$ includes a gate configured to receive the analog current source control signal $V_{CS}$. The NMOS FETs $M_{N12}$ to $M_{N1J}$ include gates configured to receive the other digital components BS2 to BSJ of the BS control signal, respectively. The BS1 control signal operates the NMOS FET $M_{N11}$ as a current sink, and the BS2 to BSJ control signals operate the NMOS FETs $M_{N12}$ to $M_{N1J}$ as switching devices. The BS control signal BS1 to BSJ for the NMOS FETs $M_{N11}$ to $M_{N1J}$ may be complementary to the BS control signal BS1 to BSJ for the PMOS FETs $M_{P11}$ to $M_{P11}$ so that the first band select circuit 320-P sources substantially the same current sunk by the second band select circuit 320-N.

In operation, for high frequency range operation of the RO 310 (e.g., 8-16 GHz), one or more or all of the NMOS FETs $M_{N12}$ to $M_{N1J}$ are turned on to strongly couple the at least one local lower voltage rail Vss_ro to the global lower voltage rail Vss to sink a relatively large current from the RO 310 so that the RO 310 generates a VCO clock signal with a frequency within one of the high frequency ranges depending on how many of the NMOS FETs $M_{N12}$ to $M_{N1J}$ are turned on (e.g., more turned on, higher operating frequency range; and vice-versa). In such high frequency range configuration, the resistance of the NMOS FET $M_{N11}$ is significantly high compared to the turned-on resistance of the NMOS FETs $M_{N12}$ to $M_{N1J}$, such that the NMOS FET $M_{N11}$ may not have any effects on the selection of the high frequency range for the RO 310.

For low frequency range operation of the RO 310 (e.g., 1.25-8 GHz), the NMOS FETs $M_{N12}$ to $M_{N1J}$ are all turned off, and the NMOS FET $M_{N11}$ is operated as a current sink in accordance with the control signal BS1 to sink a relatively low current from the RO 310 so that the RO 310 generates a VCO clock signal with a frequency within one of the low frequency ranges (e.g., more current, higher operating frequency range; and vice-versa).

In conjunction with the BS control signal, the $C_L$ control signal generated by the PLL control circuit 170 may also be used to set the operating frequency band of the RO 310.

For example, the speed at which the RO 310 operates is inversely related to the capacitance of each of the set of capacitors $C_1$ to $C_N$, respectively. Thus, if the RO 310 is to be operated in a relatively high frequency band, the $C_L$ control signal sets the capacitance of each of the set of capacitors $C_1$ to $C_N$ to relatively low or decouples the capacitors $C_1$ to $C_N$ from the inverters 310-1 to 310-N, respectively. Conversely, if the RO 310 is to be operated in a relatively low frequency band, the $C_L$ control signal sets the capacitance of each of the set of capacitors $C_1$ to $C_N$ to relatively high depending on the particular low frequency band.

The first VCO frequency control circuit 330-P may also be coupled between the global upper voltage rail Vdd and the at least one RO local upper voltage rail Vdd_ro. For example, the first VCO frequency control circuit 330-P may include N/2 slices or instantiations coupled between the global upper voltage rail Vdd and local upper voltage rails Vdd_ro1 to Vdd_roN/2, respectively. As discussed in more detail further herein, the first VCO frequency control circuit 330-P is configured to supply current from the global upper voltage rail Vdd to the RO 310 via the at least one local upper voltage rail Vdd_ro based on the PLL frequency control signal $V_{fC}$ and components VC1 to VCK of the kvco control signal VC generated by the PLL control circuit 170. In this regard, the more current supplied to the RO 310, the greater speed at which the RO 310 operates, and higher the frequency of the VCO clock signal $f_{VCO}$ generated by the RO 310; and vice-versa. The first VCO frequency control circuit 330-P may provide a finer frequency control of the VCO clock signal $f_{VCO}$ to maintain PLL 100 locked with the set kvco parameter. Whereas, the first band select circuit 320-P may provide a coarser frequency control of the VCO clock signal $f_{VCO}$ to set the operating frequency range of the VCO 300.

More specifically, the first VCO frequency control circuit 330-P includes a set of FETs $M_{P21}$ to $M_{P2k}$ (each of which may be implemented as a PMOS FET) and a set of switching devices $SW_{P1}$ to $SW_{PK}$. The set of PMOS FETs $M_{P21}$ to $M_{P2k}$ are coupled between the global upper voltage rail Vdd and the at least one RO local upper voltage rail Vdd_ro.

That is, each of the set of PMOS FETs $M_{P21}$ to $M_{P2K}$ includes a source coupled to the global upper voltage rail Vdd and a drain coupled to the at least one RO local upper voltage rail Vdd_ro. The PMOS FETs $M_{P21}$ to $M_{P2K}$ include gates configured to receive the PLL frequency control signal $V_{fC}$ via the set of switching devices $SW_{P1}$ to $SW_{PK}$, respectively. When provided to the gates of the PMOS FETs $M_{P21}$ to $M_{P2K}$ via the switching devices $SW_{P1}$ to $SW_{PK}$, the PLL frequency control signal $V_{fC}$ operates the PMOS FETs $M_{P21}$ to $M_{P2K}$ as current sources, respectively.

The second VCO frequency control circuit 330-N may also be coupled between the at least one RO local lower voltage rail Vss_ro and the global lower voltage rail Vss. For example, the second VCO frequency control circuit 330-N may include N/2 slices or instantiations coupled between local lower voltage rails Vss_ro1 to Vss_roN/2 and the global lower voltage rail Vss, respectively. As discussed in more detail further herein, the second VCO frequency control circuit 330-N is configured to sink current from the RO 310 to the global lower voltage rail Vss via the at least one local lower voltage rail Vss_ro based on the PLL frequency control signal $V_{fC}$ and digital components VC1 to VCK of the kvco control signal VC generated by the PLL control circuit 170. In this regard, the more current sunk from the RO 310, the greater speed at which the RO 310 operates, and higher the frequency of the VCO clock signal $f_{VCO}$ generated by the RO 310; and vice-versa. The second VCO frequency control circuit 330-N may provide a finer frequency control of the VCO clock signal $f_{VCO}$ to maintain PLL 100 locked with the set kvco parameter. Whereas, the second band select circuit 320-N may provide a coarser frequency control of the VCO clock signal $f_{VCO}$ to set the operating frequency range of the VCO 300.

More specifically, the second VCO frequency control circuit 330-N includes a set of FETs $M_{N21}$ to $M_{N2k}$ (each of which may be implemented as an NMOS FET) and a set of switching devices $SW_{N1}$ to $SW_{NK}$. The set of NMOS FETs $M_{N21}$ to $M_{N2k}$ are coupled between the at least one RO local lower voltage rail Vss_ro and the global lower voltage rail Vss. That is, each of the set of NMOS FETs $M_{N21}$ to $M_{N2K}$ includes a drain coupled to the at least one RO local lower voltage rail Vss_ro and a source coupled to the global lower voltage rail Vss. The NMOS FETs $M_{N21}$ to $M_{N2K}$ include gates configured to receive the PLL frequency control signal $V_{fC}$ via the set of switching devices $SW_{N1}$ to $SW_{NK}$, respectively. When provided to the gates of the NMOS FETs $M_{N21}$ to $M_{N2K}$ via the switching devices $SW_{N1}$ to $SW_{NK}$, the PLL frequency control signal $V_{fC}$ operates the NMOS FETs $M_{N21}$ to $M_{N2K}$ as current sinks, respectively. The PLL frequency control signal $V_{fC}$ for the NMOS FETs $M_{N21}$ to $M_{N2J}$ may be complementary to the PLL frequency control signal $V_{fC}$ for the PMOS FETs $M_{P21}$ to $M_{P2J}$ so that the first VCO frequency control circuit 330-P sources substantially the same current sunk by the second VCO frequency control circuit 330-N.

The first and second VCO frequency control circuits 330-P and 330-N operate as follows: When provided to the gates of the PMOS FETs $M_{P21}$ to $M_{P2K}$ and NMOS FETs $M_{N21}$ to $M_{N2K}$, the PLL frequency control signal $V_{fC}$ operates the PMOS FETs $M_{P21}$ to $M_{P2K}$ and NMOS FETs $M_{N21}$ to $M_{N2K}$ as current sources and sinks so as to maintain the PLL 100 in locked condition, respectively (e.g., the lower/ higher the PLL frequency control signal $V_{fC}$, the higher current sources and sunk by the PMOS FETs $M_{P21}$ to $M_{P2K}$ and NMOS FETs $M_{N21}$ to $M_{N2K}$; and vice-versa, respectively). The VC1 to VCK control the on/off states of the switching devices $SW_{P1}/SW_{N1}$ to $SW_{PK}/SW_{NK}$ components of the control signal VC is to set the kvco parameter of the VCO 300, respectively. The more switching devices $SW_{P1}/SW_{N1}$ to $SW_{PK}/SW_{NK}$ turned on, the higher kvco parameter, and vice-versa.

Figure 4:
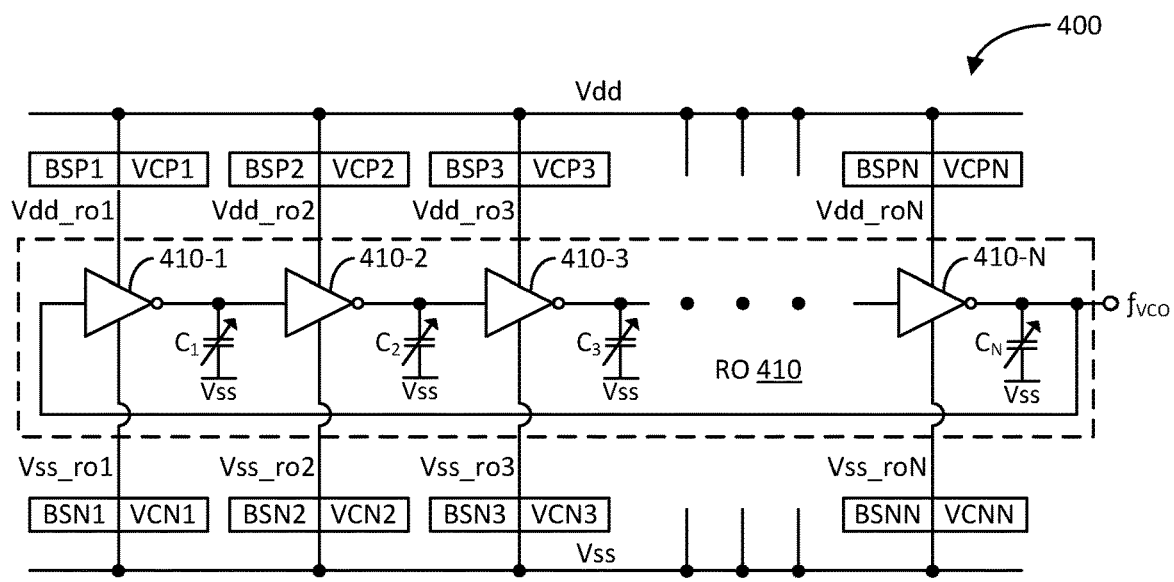
FIG. 4 illustrates a block/schematic diagram of another example voltage controlled oscillator (VCO) in accordance with another aspect of the disclosure.

FIG. 4 illustrates a block/schematic diagram of another example voltage controlled oscillator (VCO) 400 in accordance with another aspect of the disclosure. The previous VCOs 200 and 300 previously discussed may not generate a VCO clock signal $f_{VCO}$ that has rail-to-rail swing between Vdd and Vss potential. This is because the band select circuits 220-P/220-N and 320-P/320-N, and the VCO frequency control circuits 230-P/230-N and 330-P/330-N are common to the set of inverters 210-1 to 210-N and 310-1 to 310-N, respectively.

That is, at any given time, at least one of the set of inverters is turned on and drawing current from the band select circuits and the VCO frequency control circuits. In such case, the band select circuits and the VCO frequency control circuits collectively operate as current sources/sinks where the local voltage rails Vdd_ro and Vss_ro are at Vdd-Vds and Vds potentials, respectively, where Vds is the drain-to-source voltage of the transistor associated with the current sources/sinks FETs. Thus, the VCO clock signal $f_{VCO}$ swings between Vdd-Vds and Vds, which is not rail-to-rail swing between Vdd and Vss. In VCO 400, as discussed in more detail further herein, there are a set of band select circuits and a set of VCO frequency control circuits for the set of inverters, respectively; which cause the VCO clock signal $f_{VCO}$ to achieve substantially Vdd/Vss rail-to-rail swing.

In particular, the VCO 400 includes a ring oscillator (RO) 410, a first set of band select circuits BSP1 to BSPN, a second set of band select circuits BSN1 to BSNN, a first set of VCO frequency control circuits VCP1 to VCPN, and a second set of VCO frequency control circuits VCN1 to VCNN.

The RO 410 includes a set of N cascaded inverters 410-1 to 410-N arranged in a ring (where N is a positive integer number). That is, the inverters 410-1 to 410-N include outputs coupled to inputs of inverters 410-2 to 410-N and to 410-1, respectively. The set of inverters 410-1 to 410-N are coupled between a set of local upper voltage rails Vdd_ro1 to Vdd_roN and a set of local lower voltage rails Vss_ro1 to Vss_roN, respectively. The RO 410 may further include a set of load capacitors $C_1$ to $C_N$, each of which may have a programmable or variable capacitance, coupled between the outputs of the set of inverters 410-1 to 410-N and a more global lower voltage rail Vss (e.g., ground), respectively.

The first set of band select circuits BSP1 to BSPN may be coupled between a more global upper voltage rail Vdd and the RO local upper voltage rail Vdd_ro. Each of the first set of band select circuits BSP1 to BSPN, which may each be implemented per first band select circuit 220-P or 320-P previously discussed in detail, is configured to supply current from the global upper voltage rail Vdd to the set of inverters 410-1 to 410-N via the set of local upper voltage rails Vdd_ro1 to Vdd_roN based on the band select control signal BS (not shown in FIG. 4) generated by the PLL control circuit 170, respectively. As previously discussed, the more current supplied to the set of inverters 410-1 to 410-N, the greater speed at which the RO 410 operates, and higher the frequency of the VCO clock signal $f_{VCO}$ generated by the RO 410; and vice-versa. Accordingly, the RO 410 may be operated in different frequency bands based on the BS control signal.

Similarly, the second set of band select circuits BSN1 to BSNN may be coupled between the set of RO local lower voltage rails Vss_ro1 to Vss_roN and the global lower voltage rail Vss, respectively. Each of the second set of band select circuits BSN1 to BSNN, which may each be implemented per second band select circuit 220-N or 320-N previously discussed in detail, is configured to sink current from the set of inverters 410-1 to 410-N to the global lower voltage rail Vss via the set of local lower voltage rails Vss_ro1 to Vss_roN based on the band select control signal BS generated by the PLL control circuit 170, respectively. In this regard, the more current sunk from the RO 410, the greater speed at which the RO 410 operates, and higher the frequency of the VCO clock signal $f_{VCO}$ generated by the RO 410; and vice-versa. Accordingly, the RO 410 may be operated in different frequency bands based on the BS control signal.

In conjunction with the BS control signal, the $C_L$ control signal (not shown in FIG. 4) generated by the PLL control circuit 170 may also be used to set the operating frequency band of the RO 410. For example, the speed at which the RO 410 operates is inversely related to the capacitance of each of the set of capacitors $C_1$ to $C_N$, respectively. Thus, if the RO 410 is to be operated in a relatively high frequency band, the $C_L$ control signal sets the capacitance of each of the set of capacitors $C_1$ to $C_N$ to relatively low or decouples the capacitors $C_1$ to $C_N$ from the inverters 410-1 to 410-N, respectively. Conversely, if the RO 410 is to be operated in a relatively low frequency band, the $C_L$ control signal sets the capacitance of each of the set of capacitors $C_1$ to $C_N$ to relatively high depending on the particular low frequency band in which the RO 410 is to be operated.

The first set of VCO frequency control circuits VCP1 to VCPN may also be coupled between the global upper voltage rail Vdd and the set of RO local upper voltage rails Vdd_ro1 to Vdd_roN, respectively. Each of the first set of VCO frequency control circuits VCP1 to VCPN, which may each be implemented per first VCO frequency control circuit 230-P or 330-P previously discussed in detail, is configured to supply current from the global upper voltage rail Vdd to the set of inverters 410-1 to 410-N via the set of local upper voltage rail Vdd_ro1 to Vdd_roN based on the PLL frequency control signal $V_{fC}$ (not shown in FIG. 4) and components VC1 to VCK of the kvco control signal VC (not shown in FIG. 4) generated by the PLL control circuit 170, respectively. In this regard, the more current supplied to that the set of inverters 410-1 to 410-N, the greater speed at which the RO 410 operates, and higher the frequency of the VCO clock signal $f_{VCO}$ generated by the RO 410; and vice-versa. The first set of VCO frequency control circuits VCP1 to VCPN may provide a finer frequency control of the VCO clock signal $f_{VCO}$ to maintain PLL 100 locked with the set kvco parameter.

The second set of VCO frequency control circuits VCN1 to VCNN may also be coupled between the set of RO local lower voltage rails Vss_ro1 to Vss_roN and the global lower voltage rail Vss, respectively. Each of the second set of VCO frequency control circuits VCN1 to VCNN, which may each be implemented per second VCO frequency control circuit 230-N or 330-N previously discussed in detail, is configured to sink current from the set of inverters 410-1 to 410-N to the global lower voltage rail Vss via the set of local lower voltage rail Vss_ro1 to Vss_roN based on the PLL frequency control signal $V_{fC}$ and components VC1 to VCK of the kvco control signal VC generated by the PLL control circuit 170, respectively. In this regard, the more current sunk from the set of inverters 410-1 to 410-N, the greater speed at which the RO 410 operates, and higher the frequency of the VCO clock signal $f_{VCO}$ generated by the RO 410; and vice-versa. The second set of VCO frequency control circuits VCN1 to VCNN may provide a finer frequency control of the VCO clock signal $f_{VCO}$ to maintain PLL 100 locked with the set kvco parameter.

By individualizing each inverter with each pair of band select circuits and each pair of VCO frequency control circuits, the RO 410 is able to generate the VCO clock signal $f_{VCO}$ with substantially rail-to-rail swing between Vdd and Vss potentials. That is, when a particular inverter is outputting a high logic voltage, the potential at the corresponding local upper voltage rail rises to substantially Vdd potential, and any current sources in the corresponding band select circuit and VCO frequency control circuit operate in their triode regions (e.g., Vds is substantially 0V). Similarly, when a particular inverter is outputting a low logic voltage, the potential at the corresponding local lower voltage rail decreases to substantially Vss potential, and any current sources in the corresponding band select circuit and VCO frequency control circuit operate in their triode regions (e.g., Vds is substantially 0V).

Figure 5:
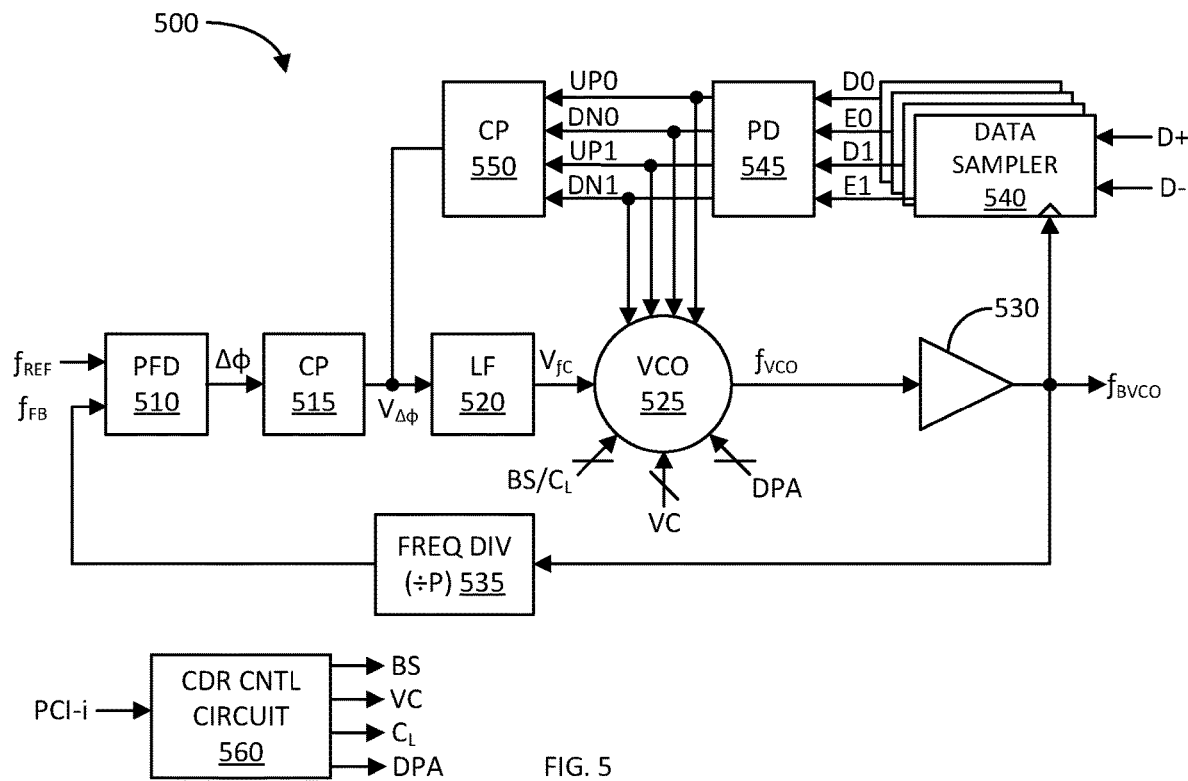
FIG. 5 illustrates a block diagram of an example clock and data recovery (CDR) circuit in accordance with another aspect of the disclosure.

FIG. 5 illustrates a block diagram of an example clock and data recovery (CDR) circuit 500 in accordance with another aspect of the disclosure. The CDR 500 may employ a phase lock loop (PLL) similar to PLL 100 for wideband applications, such as to provide CDR functionality to data reception associated with, for example, any of the PCI-i protocol.

In particular, the CDR 500 includes a phase-frequency detector (PFD) 510, a first charge pump (CP) 515, a loop filter (LF) 520, a voltage controlled oscillator (VCO) 525, a buffer 530, and a frequency divider 535. Additionally, the CDR 500 includes a data sampler 540, a phase detector (PD) 545, and a second charge pump (CP) 550. Further, the CDR 500 may include a CDR control circuit 560 for controlling the operations of the CDR 500, as discussed further herein.

As discussed, the PLL portion of the CDR 500 is similar to the PLL 100 previously discussed in detail. That is, the PFD 510 is configured to receive a reference clock signal $f_{REF}$ and a feedback clock signal $f_{FB}$, and generate a signal $\Delta\phi$ based on a phase/frequency difference between the signals $f_{REF}$ and $f_{FB}$. The first charge pump 515 is configured to generate a first portion of a control voltage or signal $V_{\Delta\phi}$ based on the phase difference signal $\Delta\phi$ (a second portion of the control voltage or signal $V_{\Delta\phi}$ being generated by the second charge pump 550, as discussed further herein). The loop filter 520 is configured to low pass filter (LPF) the control signal $V_{\Delta\phi}$ to generate a PLL frequency control signal $V_{fC}$. The VCO 525 is configured to generate a VCO clock signal $f_{VCO}$ based on the PLL frequency control signal $V_{fC}$, a kvco control (VC) signal, a band select (BS) signal, a load capacitance control signal $C_L$, a set of data phase alignment control signals UP0, DN0, UP1, and DN1, and a data phase alignment (DPA) signal.

The buffer 530 is configured to buffer the output of the VCO 525 (e.g., at which the VCO clock signal $f_{VCO}$ is generated), and generate a buffered VCO clock signal $f_{BVCO}$. For example, the buffer 530 may be configured to correct the skew in the VCO clock signal $f_{VCO}$ to generate the buffered VCO clock signal $f_{BVCO}$ with substantially 50 percent (%) duty cycle. The frequency divider 535 may be configured to frequency divide the buffered VCO clock signal $f_{BVCO}$ by an integer or fractional divider ratio (P) to generate the feedback clock signal $f_{FB}$. When the PLL portion of the CDR 500 is phase/frequency locked, the VCO clock signal $f_{VCO}$ and the buffered VCO clock signal $f_{BVCO}$ have a frequency P times the frequency of the reference clock signal $f_{REF}$.

The data sampler 540 is configured to receive and sample a differential data signal D+/D− to generate sampled data signals D0, D1, E0 and E1 based on the buffered VCO clock signal $f_{BVCO}$. The phase detector 545 is configured to generate data phase alignment control signals UP0, DN0, UP1, and DN1 based on the sampled data signals D0, D1, E0 and E1. The second charge pump 550 is configured to generate the second portion of the control signal $V_{\Delta\phi}$ based on the data phase alignment control signals UP0, DN0, UP1, and DN1. The control signal $V_{\Delta\phi}$ may be the sum of the signals generated by the charge pumps 515 and 550.

The CDR control circuit 560 may be configured to receive an input control signal, such as, for example, a PCI-i signal for selecting the protocol "i" (e.g., i=1.1 to 5.0), for setting the frequency of the VCO clock signal $f_{VCO}$ suitable for the selected protocol PCI-i. Accordingly, the CDR control circuit 560 is configured to generate control signals BS, $C_L$, VC, and DPA for controlling the VCO 525 in generating of the VCO clock signal $f_{VCO}$ based on the input control signal PCI-i. As previously discussed, the BS and $C_L$ control signals configure the VCO 525 to operate within certain defined frequency ranges (e.g., ~1.25 GHz if PCI-i signal indicates i=1.1; ~4 GHz if PCI-i signal indicates i=3.1; and ~16 GHz if PCI-i signal indicates i=5.0). The VC control signal sets the kvco factor of the VCO 525. The DPA control signal controls how responsive the VCO 525 is with respect to the data phase alignment control signals UP0, DN0, UP1, and DN1.

Figure 6:
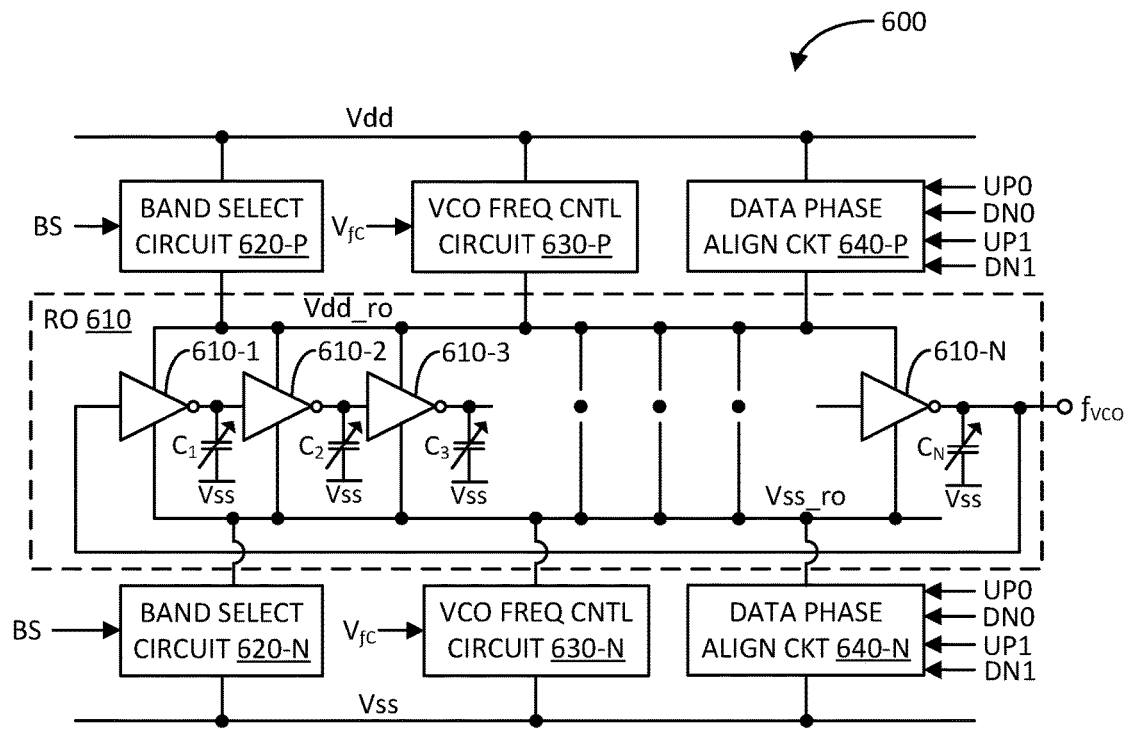
FIG. 6 illustrates a block/schematic diagram of another example voltage controlled oscillator (VCO) in accordance with another aspect of the disclosure.

FIG. 6 illustrates a block/schematic diagram of an example voltage controlled oscillator (VCO) 600 in accordance with another aspect of the disclosure. The VCO 600 may be an example more detailed implementation of the VCO 525 of CDR 500. Further, the VCO 600 is similar to VCO 200 previously discussed in detail, with the addition of the data phase alignment control feature. In particular, the VCO 600 includes a ring oscillator (RO) 610, a first band select circuit 620-P, a second band select circuit 620-N, a first VCO frequency control circuit 630-P, a second VCO frequency control circuit 630-N, a first data phase alignment circuit 640-P, and a second data phase alignment circuit 640-N.

The RO 610 includes a set of N cascaded inverters 610-1 to 610-N arranged in a ring (where N is a positive integer number). That is, the inverters 610-1 to 610-N include outputs coupled to inputs of inverters 610-2 to 610-N and to 610-1, respectively. The set of inverters 610-1 to 610-N are coupled between a local upper voltage rail Vdd_ro and a local lower voltage rail Vss_ro. The RO 610 may further include a set of load capacitors $C_1$ to $C_N$, each of which may have a programmable or variable capacitance, coupled between the outputs of the set of inverters 610-1 to 610-N and a more global lower voltage rail Vss (e.g., ground), respectively.

The first band select circuit 620-P may be coupled between a more global upper voltage rail Vdd and the RO local upper voltage rail Vdd_ro. Similar to first band select circuit 220-P, the first band select circuit 620-P is configured to supply current from the global upper voltage rail Vdd to the RO 610 via the local upper voltage rail Vdd_ro based on the band select control signal BS to configure the RO 610 to operate in different frequency bands. Similarly, the second band select circuit 620-N may be coupled between the RO local lower voltage rail Vss_ro and the global lower voltage rail Vss. Similar to the second band select circuit 220-N, the second band select circuit 620-N is configured to sink current from the RO 610 to the global lower voltage rail Vss via the local lower voltage rail Vss_ro based on the band select control signal BS to configure the RO 610 to operate in different frequency bands. In conjunction with the BS control signal, the $C_L$ control signal generated by the CDR control circuit 560 may also be used to set the operating frequency band of the RO 610, as previously discussed with respect to VCO 200.

The first VCO frequency control circuit 630-P may also be coupled between the global upper voltage rail Vdd and the RO local upper voltage rail Vdd_ro. Similar to the first VCO frequency control circuit 230-P, the first VCO frequency control circuit 630-P is configured to supply current from the global upper voltage rail Vdd to the RO 610 via the local upper voltage rail Vdd_ro based on the PLL frequency control signal $V_{fC}$ to maintain PLL portion of the CDR 500 locked. Similarly, the second VCO frequency control circuit 630-N may be coupled between the RO local lower voltage rail Vss_ro and the global lower voltage rail Vss. Similar to the second VCO frequency control circuit 230-N, the second VCO frequency control circuit 630-N is configured to sink current from the RO 610 to the global lower voltage rail Vss via the local lower voltage rail Vss_ro based on the PLL frequency control signal $V_{fC}$ to maintain PLL portion of the CDR 500 locked.

The first data phase alignment circuit 640-P may also be coupled between the global upper voltage rail Vdd and the RO local upper voltage rail Vdd_ro. The first data phase alignment circuit 640-P is configured to supply current from the global upper voltage rail Vdd to the RO 610 via the local upper voltage rail Vdd_ro based on the data phase alignment control signals UP0, DN0, UP1, and DN1 to phase align (e.g., the center of the eye diagram associated with) the differential data signal D+/D− with (e.g., a sampling edge of) the buffered VCO clock signal $f_{BVCO}$, as discussed in more detail further herein. Similarly, the second data phase alignment circuit 640-N may also be coupled between the RO local lower voltage rail Vss_ro and the global lower voltage rail Vss. The second data phase alignment circuit 640-N is configured to sink current from the RO 610 to the global lower voltage rail Vss via the local lower voltage rail Vss_ro based on the data phase alignment control signals UP0, DN0, UP1, and DN1 to phase align (e.g., the center of the eye diagram associated with) the differential data signal D+/D− with (e.g., a sampling edge of) the buffered VCO clock signal $f_{BVCO}$, as discussed in more detail further herein.

Figure 7:
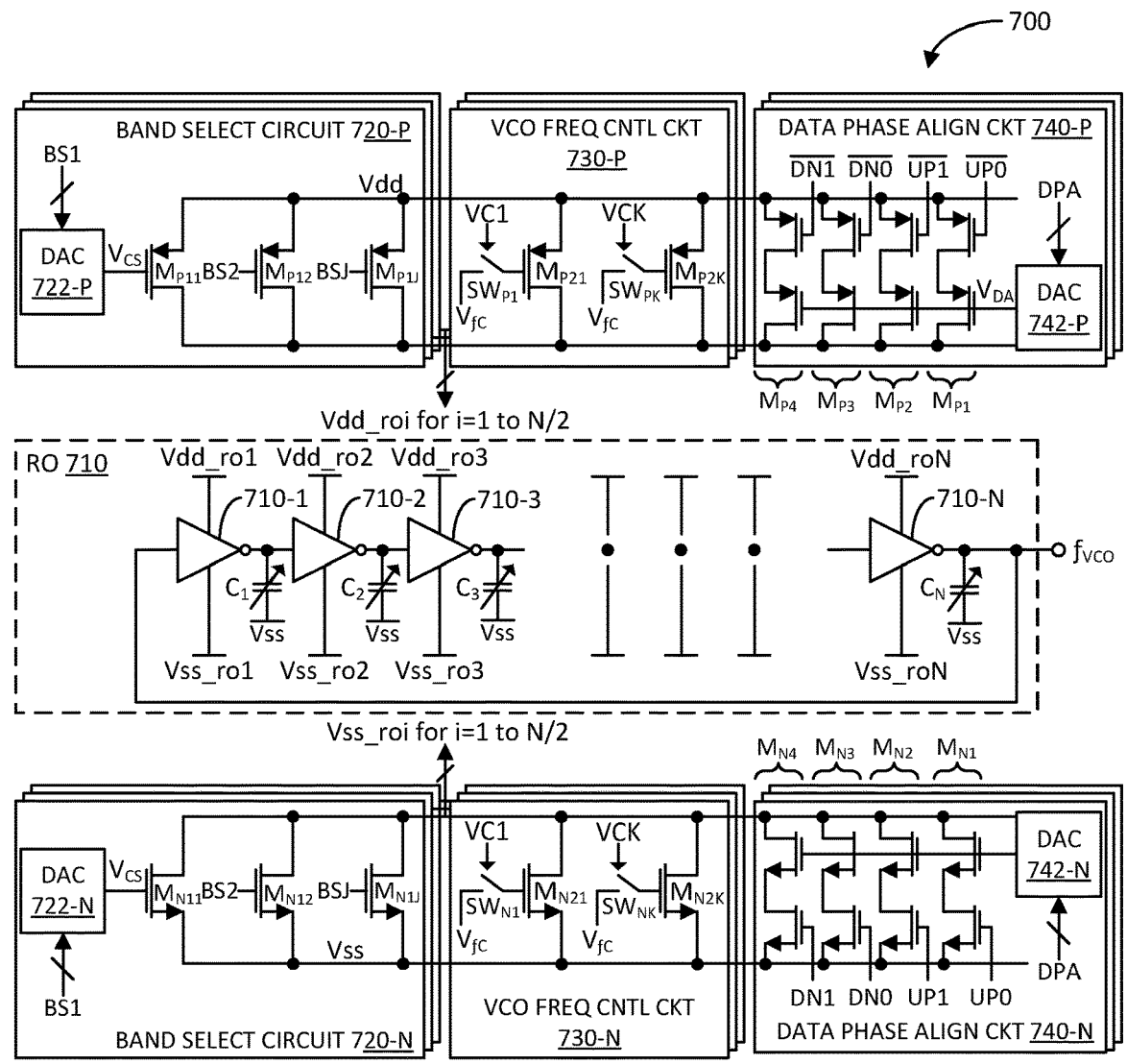
FIG. 7 illustrates a schematic diagram of another example voltage controlled oscillator (VCO) in accordance with another aspect of the disclosure.

FIG. 7 illustrates a schematic diagram of another example voltage controlled oscillator (VCO) 700 in accordance with another aspect of the disclosure. The VCO 700 may be an example more detailed implementation of the VCO 600 previously discussed. In particular, the VCO 700 includes a ring oscillator (RO) 710, a first band select circuit 720-P, a second band select circuit 720-N, a first VCO frequency control circuit 730-P, a second VCO frequency control circuit 730-N, a first data phase alignment circuit 740-P, and a second data phase alignment circuit 740-N.

The RO 710 includes a set of cascaded inverters 710-1 to 710-N arranged in a ring (where N is a positive integer number). That is, the inverters 710-1 to 710-N include outputs coupled to inputs of inverters 710-2 to 710-N and to 710-1, respectively. The set of inverters 710-1 to 710-N are coupled between at least one local upper voltage rail Vdd_ro (e.g., Vdd_ro1 to Vdd_roN/2) and at least one local lower voltage rail Vss_ro (e.g., Vss_ro1 to Vss_roN/2). For example, to reduce or substantially isolate switching noise between inverters 710-1 to 710-N, each pair of inverters 710-i/710-(i+N/2) is coupled between local upper and lower voltage rails Vdd_roi and Vss_roi for i=1 to N/2. The RO 710 may further include a set of load capacitors $C_1$ to $C_N$, each of which may have a programmable or variable capacitance, coupled between the outputs of the set of inverters 710-1 to 710-N and a more global lower voltage rail Vss (e.g., ground), respectively.

The first band select circuit 720-P may be coupled between a more global upper voltage rail Vdd and the at least one RO local upper voltage rail Vdd_ro. For example, the first band select circuit 720-P may include N/2 slices or instantiations coupled between the global upper voltage rail Vdd and local upper voltage rails Vdd_ro1 to Vdd_roN/2, respectively. Similar to first band select circuit 320-P or 620-P, the first band select circuit 720-P is configured to supply current from the global upper voltage rail Vdd to the RO 710 via the at least one local upper voltage rail Vdd_ro based on the band select control signal BS to configure the RO 710 to operate in different frequency bands. Also, similar to first band select circuit 320-P, the first band select circuit 620-P includes a DAC 722-P configured to generate a current source control signal $V_{CS}$ based on a first digital component BS1 of a band select signal BS to control a PMOS FET $M_{P11}$ (coupled between Vdd and Vdd_ro) as a current source for low frequency band operations, as previously discussed. The first band select circuit 720-P includes a set of PMOS FETs $M_{P12}$ to $M_{P1J}$ (each coupled between Vdd and Vdd_ro), whose switching on/off state is controlled by a set of other digital components BS2 to BSJ of the band select signal BS, respectively.

The operation of the first band select circuit 720-P has been previously discussed in detail with respect to the first band select circuit 320-P.

Similarly, the second band select circuit 720-N may be coupled between the at least one RO local lower voltage rail Vss_ro and the global lower voltage rail Vss. For example, the second band select circuit 720-N may include N/2 slices or instantiations coupled between local lower voltage rails Vss_ro1 to Vss_roN/2 and the global lower voltage rail Vss, respectively. Similar to second band select circuit 320-N or 620-N, the second band select circuit 720-N is configured to sink current from the RO 710 to the global lower voltage rail Vss via the at least one local upper voltage rail Vss_ro based on the band select control signal BS to configure the RO 710 to operate in different frequency bands. Also, similar to second band select circuit 320-N, the second band select circuit 720-N includes a DAC 722-N configured to generate an analog current source control signal $V_{CS}$ based on a first digital component BS1 of a band select signal BS to control a NMOS FET $M_{N11}$ (coupled between Vss_ro and Vss) as a current sink for low frequency band operations, as previously discussed. The second band select circuit 720-N includes a set of NMOS FETs $M_{N12}$ to $M_{N1J}$ (each coupled between Vss_ro and Vss), whose switching on/off state is controlled by the set of other digital components BS2 to BSJ of the band select signal BS, respectively. The operation of the second band select circuit 720-N has been previously discussed in detail with respect to the second band select circuit 320-N.

Similarly, in conjunction with the BS control signal, the $C_L$ control signal generated by the PLL control circuit 170 may also be used to set the operating frequency band of the RO 710, as previously discussed with respect to VCO 300.

The first VCO frequency control circuit 730-P may also be coupled between the global upper voltage rail Vdd and the at least one RO local upper voltage rail Vdd_ro. For example, the first VCO frequency control circuit 730-P may include N/2 slices or instantiations coupled between the global upper voltage rail Vdd and local upper voltage rails Vdd_ro1 to Vdd_roN/2, respectively. Similar to first VCO frequency control circuit 330-P or 630-P, the first VCO frequency control circuit 730-P is configured to supply current from the global upper voltage rail Vdd to the RO 710 via the at least one local upper voltage rail Vdd_ro based on the PLL frequency control signal $V_{fC}$ and components VC1 to VCK of the kvco control signal VC to maintain the PLL portion of the CDR 500 locked with the set kvco parameter. Similar to first VCO frequency control circuit 330-P, the first VCO frequency control circuit 730-P includes a set of PMOS FETs $M_{P21}$ to $M_{P2K}$ and a set of switching devices $SW_{P1}$ to $SW_{PK}$. The set of PMOS FETs $M_{P21}$ to $M_{P2K}$ are coupled between the global upper voltage rail Vdd and the RO local upper voltage rail Vdd_ro. The PMOS FETs $M_{P21}$ to $M_{P2K}$ include gates configured to receive the PLL frequency control signal $V_{fC}$ via the set of switching devices $SW_{P1}$ to $SW_{PK}$, respectively.

The operation of the first VCO frequency control circuit 730-P has been previously discussed in detail with respect to the first VCO frequency control circuit 330-P.

Similarly, the second VCO frequency control circuit 730-N may also be coupled between the at least one RO local lower voltage rail Vss_ro and the global lower voltage rail Vss.

For example, the second VCO frequency control circuit 730-N may include N/2 slices or instantiations coupled between local lower voltage rails Vss_ro1 to Vss_roN/2 and the global lower voltage rail Vss, respectively. Similar to second VCO frequency control circuit 330-N or 630-N, the second VCO frequency control circuit 730-N is configured to sink current from the RO 710 to the global lower voltage rail Vss via the at least one local lower voltage rail Vss_ro based on the PLL frequency control signal $V_{fC}$ and components VC1 to VCK of the kvco control signal VC to maintain the PLL portion of the CDR 500 locked with the set kvco parameter. Similar to second VCO frequency control circuit 330-N, the second VCO frequency control circuit 730-N includes a set of NMOS FETs $M_{N21}$ to $M_{N2K}$ and a set of switching devices $SW_{N1}$ to $SW_{NK}$. The set of NMOS FETs $M_{N21}$ to $M_{N2K}$ are coupled between the RO local lower voltage rail Vss_ro and the global lower voltage rail Vss. The NMOS FETs $M_{N21}$ to $M_{N2K}$ include gates configured to receive the PLL frequency control signal $V_{fC}$ via the set of switching devices $SW_{N1}$ to $SW_{NK}$, respectively. The operation of the second VCO frequency control circuit 730-N has been previously discussed in detail with respect to the second VCO frequency control circuit 330-N.

The first data phase alignment circuit 740-P may also be coupled between the global upper voltage rail Vdd and the at least one RO local upper voltage rail Vdd_ro. For example, the first data phase alignment circuit 740-P may include N/2 slices or instantiations coupled between the global upper voltage rail Vdd and local upper voltage rails Vdd_ro1 to Vdd_roN/2, respectively. The first data phase alignment circuit 740-P includes a set of switching FETs coupled in series with a set of current source FETs (e.g., both sets of FETs each include a PMOS FET), which may be referred to collectively as a set of selectable current sources $M_{P1}$ to $M_{P4}$, respectively. The set of selectable current sources $M_{P1}$ to $M_{P4}$ are coupled between the global upper voltage rail Vdd and the at least one RO local upper voltage rail Vdd_ro. The set of switching PMOS FETs include gates configured to receive complementary data phase alignment control signal $\overline{UP0}$, $\overline{UP1}$, $\overline{DN0}$, and $\overline{DN1}$, respectively. The first data phase alignment circuit 740-P further includes a digital-to-analog converter (DAC) 742-P configured to generate an analog current source control signal $V_{DA}$ based on a digital data phase alignment (DPA) signal generated by the CDR control circuit 560. The DAC 742-P is coupled to the gates of the set of current source FETs to provide the current source control signal $V_{DA}$ thereto.

The second data phase alignment circuit 740-N may also be coupled between the at least one RO local lower voltage rail Vss_ro and the global lower voltage rail Vss. For example, the second data phase alignment circuit 740-N may include N/2 slices or instantiations coupled between local lower voltage rails Vss_ro1 to Vss_roN/2 and the global lower voltage rail Vss, respectively. The second data phase alignment circuit 740-N includes a set of current source FETs coupled in series with a set of switching FETs (e.g., both sets of FETs each include an NMOS FET), which may be referred to collectively as a set of selectable current sinks $M_{N1}$ to $M_{N4}$, respectively. The set of selectable current sinks $M_{N1}$ to $M_{N4}$ are coupled between the at least one RO local lower voltage rail Vss_ro and the global lower voltage rail Vss. The set of switching NMOS FETs include gates configured to receive non-complementary data phase alignment control signals UP0, UP1, DN0, and DN1, respectively. The second data phase alignment circuit 740-N further includes a DAC 742-N configured to generate an analog current source control signal $V_{DA}$ based on the digital data phase alignment (DPA) signal generated by the CDR control circuit 560. The DAC 742-N is coupled to the gates of the set of current source FETs to provide the current source control signal $V_{DA}$ thereto. The signal $V_{DA}$ generated by the DAC 742-N may be complementary of the $V_{DA}$ signal generated by the DAC 742-P, as previously mentioned.

In operation, when the eye diagram region of the differential data signal D+/D− is phase aligned with a sampling edge of the buffered VCO clock signal $f_{BVCO}$, the data phase alignment signals DN/$\overline{DN0}$ and UP/$\overline{UP0}$ are asserted (e.g., at logic high/low (Vdd/Vss)), and the data phase alignment signals DN1/$\overline{DN1}$ and UP1/$\overline{UP1}$ are deasserted (e.g., at logic low/high (Vss/Vdd)). In this configuration, the first and second data phase alignment circuits 740-P and 740-N source and sinks current to and from the RO 710 to maintain the eye diagram region of the differential data signal D+/D− phase aligned with the sampling edge of the buffered VCO clock signal $f_{BVCO}$.

When the eye diagram region of the differential data signal D+/D− leads the sampling edge of the buffered VCO clock signal $f_{BVCO}$, the data phase alignment signals DN/$\overline{DN0}$, UP/$\overline{UP0}$, UP1/$\overline{UP1}$ and perhaps DN1 $\overline{DN0}$ are asserted (e.g., at logic high/low (Vdd/Vss)), and the data phase alignment signal DN1 $\overline{DN0}$ may be deasserted (e.g., at logic low/high (Vss/Vdd)). In this configuration, the first and second data phase alignment circuits 740-P and 740-N source and sinks more current to and from the RO 710 to speed up the buffered VCO clock signal $f_{BVCO}$ so that the eye diagram region of the differential data signal D+/D− eventually phase aligns with the sampling edge of buffered VCO clock signal $f_{BVCO}$.

Similarly, when the eye diagram region of the differential data signal D+/D− lags the sampling edge of the buffered VCO clock signal $f_{BVCO}$, the data phase alignment signal DN/$\overline{DN0}$ is asserted (e.g., at logic high/low (Vdd/Vss)) or perhaps none of the signals are asserted, and the data phase alignment signals' UP/$\overline{UP0}$, UP1/$\overline{UP1}$, DN $\overline{DN0}$, and perhaps DN1/$\overline{DN0}$ may be deasserted (e.g., at logic low/high (Vss/Vdd)). In this configuration, the first and second data phase alignment circuits 740-P and 740-N source and sinks less or substantially no current to and from the RO 710 to slow down the buffered VCO clock signal $f_{BVCO}$ so that the eye diagram region of the differential data signal D+/D− eventually phase aligns with the sampling edge of buffered VCO clock signal $f_{BVCO}$. The current source control signal $V_{DA}$ controls the amount of current source and sunk per each enabled current source PMOS FET and sink NMOS FET.

Figure 8:
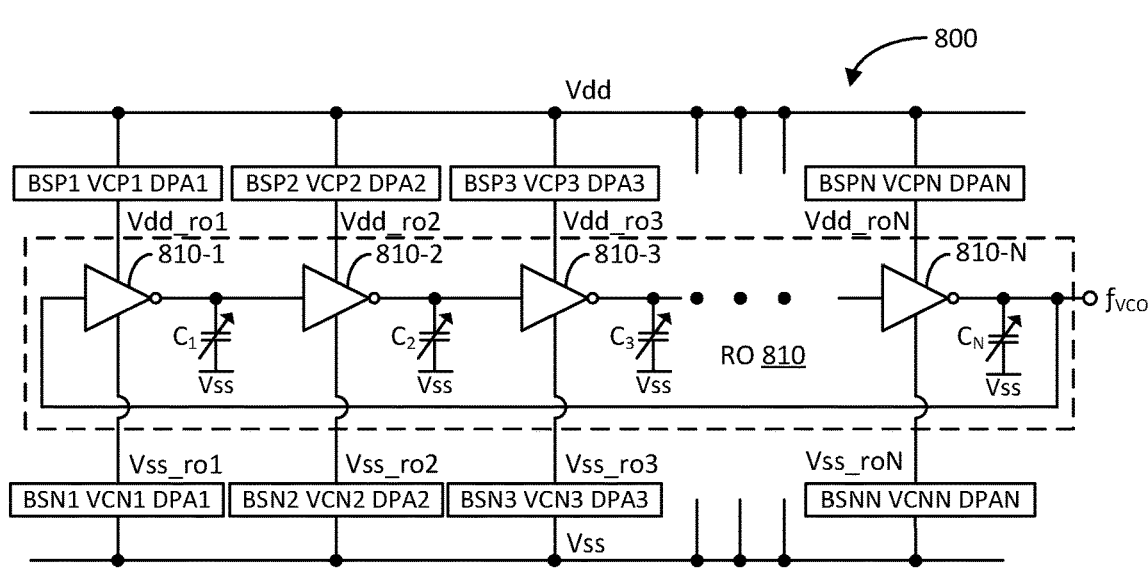
FIG. 8 illustrates a block/schematic diagram of another example voltage controlled oscillator (VCO) in accordance with another aspect of the disclosure.

FIG. 8 illustrates a block/schematic diagram of another example voltage controlled oscillator (VCO) 800 in accordance with another aspect of the disclosure. As similarly discussed with respect to VCO 400, the VCOs 600 and 700 may not generate a VCO clock signal $f_{VCO}$ that has rail-to-rail swing between Vdd and Vss potential. This is because the band select circuits 620-P/620-N and 720-P/720-N, the VCO frequency control circuits 630-P/630-N and 730-P/730-N, and data phase alignment circuits 640-P/640-N and 740-P/740-N are common to the set of inverters 610-1 to 610-N and 710-1 to 710-N, respectively.

That is, at any given time, at least one of the set of inverters is turned on and drawing current from the band select circuits, the VCO frequency control circuits, and data phase alignment circuits. In such case, the band select circuits, the VCO frequency control circuits, and the data phase alignment circuits collectively operate as current sources/sinks where the local voltage rails Vdd_ro and Vss_ro are at Vdd-Vds and Vds potentials, respectively, where Vds is the drain-to-source voltage of the associated with the current sources/sinks FETs. Thus, the VCO clock signal $f_{VCO}$ swings between Vdd-Vds and Vds, which is not rail-to-rail swing between Vdd and Vss. In VCO 800, similar to VCO 400, there are a set of band select circuits, a set of VCO frequency control circuits, and a set of data phase alignment circuits for the set of inverters, respectively; which cause the VCO clock signal $f_{VCO}$ to achieve substantially Vdd/Vss rail-to-rail swing.

In particular, the VCO 800 includes a ring oscillator (RO) 810, a first set of band select circuits BSP1 to BSPN, a second set of band select circuits BSN1 to BSNN, a first set of VCO frequency control circuits VCP1 to VCPN, a second set of VCO frequency control circuits VCN1 to VCNN, a first set of data phase alignment circuits DPA1 to DPAN, and a second set of data phase alignment circuits DANN.

The RO 810 includes a set of N cascaded inverters 810-1 to 810-N arranged in a ring (where N is a positive integer number). That is, the inverters 810-1 to 810-N include outputs coupled to inputs of inverters 810-2 to 810-N and to 810-1, respectively. The set of inverters 810-1 to 810-N are coupled between a set of local upper voltage rails Vdd_ro1 to Vdd_roN and a set of local lower voltage rails Vss_ro1 to Vss_roN, respectively. The RO 810 may further include a set of load capacitors $C_1$ to $C_N$, each of which may have a programmable or variable capacitance, coupled between the outputs of the set of inverters 810-1 to 810-N and a more global lower voltage rail Vss (e.g., ground), respectively.

The first set of band select circuits BSP1 to BSPN may be coupled between a more global upper voltage rail Vdd and the set of RO local upper voltage rails Vdd_ro1 to Vdd_roN, respectively. Each of the first set of band select circuits BSP1 to BSPN, which may be implemented per first band select circuit 620-P or 720-P previously discussed in detail, is configured to supply current from the global upper voltage rail Vdd to the set of inverters 810-1 to 810-N via the set of local upper voltage rails Vdd_ro1 to Vdd_roN based on the band select control signal BS (not shown in FIG. 8) generated by the CDR control circuit 560, respectively. As previously discussed, the more current supplied to the set of inverters 810-1 to 810-N, the greater speed at which the RO 810 operates, and higher the frequency of the VCO clock signal $f_{VCO}$ generated by the RO 810; and vice-versa. Accordingly, the RO 810 may be operated in different frequency bands based on the BS control signal.

Similarly, the second set of band select circuits BSN1 to BSNN may be coupled between the set of RO local lower voltage rails Vss_ro1 to Vss_roN and the global lower voltage rail Vss, respectively. Each of the second set of band select circuits BSN1 to BSNN, which may be implemented per second band select circuit 620-N or 720-N previously discussed in detail, is configured to sink current from the set of inverters 810-1 to 810-N to the global lower voltage rail Vss via the set of local lower voltage rails Vss_ro1 to Vss_roN based on the band select control signal BS generated by the CDR control circuit 560, respectively. In this regard, the more current sunk from the RO 810, the greater speed at which the RO 810 operates, and higher the frequency of the VCO clock signal $f_{VCO}$ generated by the RO 810; and vice-versa. Accordingly, the RO 810 may be operated in different frequency bands based on the BS control signal.

In conjunction with the BS control signal, the $C_L$ control signal (not shown in FIG. 8) generated by the CDR control circuit 560 may also be used to set the operating frequency band of the RO 810. For example, the speed at which the RO 810 operates is inversely related to the capacitance of each of the set of capacitors $C_1$ to $C_N$, respectively. Thus, if the RO 810 is to be operated in a relatively high frequency band, the $C_L$ control signal sets the capacitance of each of the set of capacitors $C_1$ to $C_N$ to relatively low or decouples the capacitors $C_1$ to $C_N$ from the inverters 810-1 to 810-N, respectively. Conversely, if the RO 810 is to be operated in a relatively low frequency band, the $C_L$ control signal sets the capacitance of each of the set of capacitors $C_1$ to $C_N$ to relatively high depending on the particular low frequency band in which the RO 810 is to be operated.

The first set of VCO frequency control circuits VCP1 to VCPN may also be coupled between the global upper voltage rail Vdd and the set of RO local upper voltage rails Vdd_ro1 to Vdd_roN, respectively. Each of the first set of VCO frequency control circuits VCP1 to VCPN, which may be implemented per first VCO frequency control circuit 630-P or 730-P previously discussed in detail, is configured to supply current from the global upper voltage rail Vdd to the set of inverters 810-1 to 810-N via the set of local upper voltage rails Vdd_ro1 to Vdd_roN based on the PLL frequency control signal $V_{fC}$ and components VC1 to VCK of the kvco control signal VC (not shown in FIG. 8) generated by the CDR control circuit 560, respectively. In this regard, the more current supplied to that the set of inverters 810-1 to 810-N, the greater speed at which the RO 810 operates, and higher the frequency of the VCO clock signal $f_{VCO}$ generated by the RO 810, and vice-versa. The first set of VCO frequency control circuits VCP1 to VCPN may provide a finer frequency control of the VCO clock signal $f_{VCO}$ to maintain the PLL portion of the CDR 500 locked with the set kvco parameter.

The second set of VCO frequency control circuits VCN1 to VCNN may also be coupled between the set of RO local lower voltage rails Vss_ro1 to Vss_roN and the global lower voltage rail Vss, respectively. Each of the second set of VCO frequency control circuits VCN1 to VCNN, which may be implemented per second VCO frequency control circuit 630-N or 730-N previously discussed in detail, is configured to sink current from the set of inverters 810-1 to 810-N to the global lower voltage rail Vss via the set of local lower voltage rails Vss_ro1 to Vss_roN based on the PLL frequency control signal $V_{fC}$ and components VC1 to VCK of the kvco control signal VC generated by the CDR control circuit 560, respectively. In this regard, the more current sunk from the set of inverters 810-1 to 810-N, the greater speed at which the RO 810 operates, and higher the frequency of the VCO clock signal $f_{VCO}$ generated by the RO 810; and vice-versa. The second set of VCO frequency control circuits VCN1 to VCNN may provide a finer frequency control of the VCO clock signal $f_{VCO}$ to maintain the PLL portion of the CDR 500 locked with the set kvco parameter.

The first set of N data phase alignment circuits DPA1 to DPAN may also be coupled between the global upper voltage rail Vdd and the set of RO local upper voltage rails Vdd_ro1 to Vdd_roN, respectively. Each of the first set of data phase alignment circuits DPA1 to DPAN, which may be implemented per first data phase alignment circuit 640-P or 740-P previously discussed in detail, is configured to supply current from the global upper voltage rail Vdd to the set of inverters 810-1 to 810-N via the set of local upper voltage rail Vdd_ro1 to Vdd_roN based on the complementary data phase alignment control signals $\overline{UP0}$, $\overline{UP1}$, $\overline{DN0}$, and $\overline{DN1}$ and current source control signal DPA (not shown in FIG. 8) generated by the CDR control circuit 560, respectively. In this regard, the more current supplied to that the set of inverters 810-1 to 810-N, the greater speed at which the RO 810 operates, and higher the frequency of the VCO clock signal $f_{VCO}$ generated by the RO 810, and vice-versa. The first set of data phase alignment circuits DPA1 to DPAN may provide an even finer frequency control of the VCO clock signal $f_{VCO}$ to phase align the eye diagram region of the differential data signal D+/D− with the sampling edge of the buffered VCO clock signal $f_{BVCO}$.

The second set of N data phase alignment circuits DPA1 to DPAN may also be coupled between the set of RO local lower voltage rails Vss_ro1 to Vss_roN and the global lower voltage rail Vss, respectively. Each of the second set of data phase alignment circuits DPA1 to DPAN, which may be implemented per second data phase alignment circuit 640-N or 740-N previously discussed in detail, is configured to sink current from the set of inverters 810-1 to 810-N to the global lower voltage rail Vss via the set of local lower voltage rail Vss_ro1 to Vss_roN based non-complementary data phase alignment control signals UP0, UP1, DN0, and DN1 and the current source control signal DPA generated by the CDR control circuit 560, respectively. In this regard, the more current sunk from the set of inverters 810-1 to 810-N, the greater speed at which the RO 810 operates, and higher the frequency of the VCO clock signal $f_{VCO}$ generated by the RO 810; and vice-versa. The second set of data phase alignment circuits DPA1 to DPAN may provide an even finer frequency control of the VCO clock signal $f_{VCO}$ to phase align the eye diagram region of the differential data signal D+/D− with the sampling edge of the buffered VCO clock signal $f_{BVCO}$.

By individualizing each inverter with each pair of band select circuits, each pair of VCO frequency control circuits, and each pair of data phase alignment circuits, the RO 810 is able to generate the VCO clock signal $f_{VCO}$ with substantially rail-to-rail swing between Vdd and Vss potentials. That is, when a particular inverter is outputting a high logic voltage, the potential at the corresponding local upper voltage rail rises to substantially Vdd potential, and any current sources in the corresponding band select circuit, VCO frequency control circuit, and data phase alignment circuit operate in their triode regions (e.g., Vds is substantially 0V). Similarly, when a particular inverter is outputting a low logic voltage, the potential at the corresponding local lower voltage rail decreases to substantially Vss potential, and any current sources in the corresponding band select circuit, VCO frequency control circuit, and data phase alignment circuit operate in their triode regions (e.g., Vds is substantially 0V).

Figure 9:
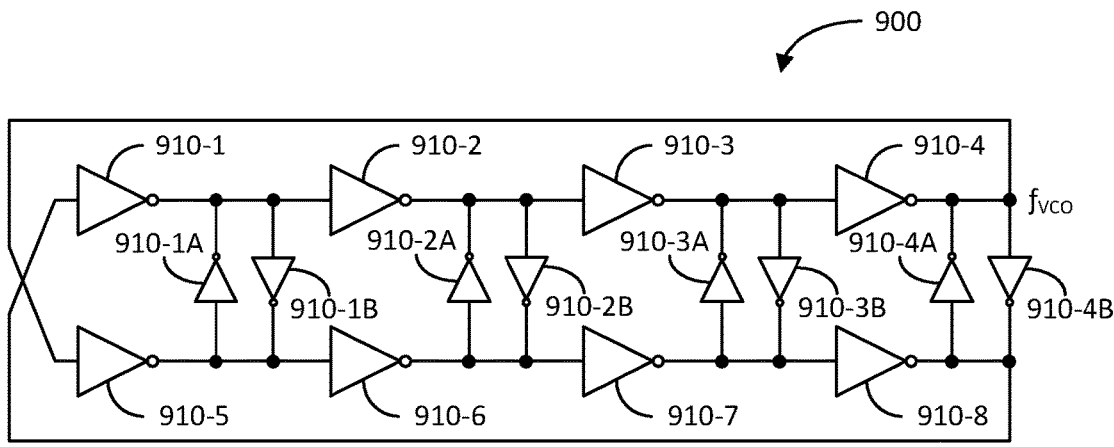
FIG. 9 illustrates a block diagram of an example ring oscillator (RO) in accordance with another aspect of the disclosure.

FIG. 9 illustrates a block diagram of an example ring oscillator (RO) 900 in accordance with another aspect of the disclosure. The RO 900 may be another example implementation of any of the ROs 210, 310, 410, 610, 710, and 810 previously discussed. The RO 900 may be particularly useful for high frequency applications, such as to achieve frequencies in the vicinity of 16 GHz. For example, the RO 900 may have a higher frequency performance than a standard RO with cascaded inverters arranged in a ring.

In particular, the RO 900 includes a set of cascaded inverters 910-1 to 910-8 arranged in a ring. In this example, there are eight (8) inverters in the set of cascaded inverters 910-1 to 910-8, but it shall be understood that the RO 900 may be implemented with a different number of cascaded inverters. Additionally, the RO 900 includes a set of cross-coupled inverters 910-1A/910-1B, 910-2A/910-2B, 910-3A/910-3B, and 910-4A/910-4B coupled across the outputs of inverters 910-1/910-5, 910-2/910-6, 910-3/910-7, and 910-4/910-8, respectively. The set of cascaded inverters and the cross-coupled inverters may be coupled between at least one local upper voltage rail (e.g., Vdd_ro or Vdd_ro1 to Vdd_ro2N) and at least one local lower voltage rail (e.g., Vss_ro or Vss_ro1 to Vss_ro2N, respectively.

In a general sense for a set of N cascaded inverters (where N in this case is an even integer), the cross-coupled inverters are coupled across the outputs of the $i^{th}$ and $(i+N/2)^{th}$ inverters for i=1 to N/2. For instance, in the example RO 900 where N=8: for i=1, the cross-coupled inverters 910-1A/910-1B are coupled across the outputs of inverters 910-1 (i=1) and 910-5 (1+8/2=1+4=5); for i=2, the cross-coupled inverters 910-2A/910-2B are coupled across the outputs of inverters 910-2 (i=2) and 910-6 (2+8/2=2+4=6); for i=3, the cross-coupled inverters 910-3A/910-3B are coupled across the outputs of inverters 910-3 (i=3) and 910-7 (3+8/2=3+4=7); and for i=4, the cross-coupled inverters 910-4A/910-4B are coupled across the outputs of inverters 910-4 (i=4) and 910-8 (4+8/2=4+4=8).

The addition of the cross-coupled inverters improves the high frequency performance of the RO 900. As mentioned above, the set of cascaded inverters 910-1 to 910-8 and the cross-coupled inverters 910-1A/910-1B, 910-2A/910-2B, 910-3A/910-3B, and 910-4A/910-4B may be coupled between a local upper voltage rail Vdd_ro and a local lower voltage rail Vss_ro, as in ROs 210 and 610. Alternatively, the set of cascaded inverters 910-1 to 910-8 and the cross-coupled inverters 910-1A/910-1B, 910-2A/910-2B, 910-3A/910-3B, and 910-4A/910-4B may each be coupled between individual local upper voltage rail (e.g., Vdd_ro1 to Vdd_roN for the cascaded inverters, and Vdd_roN+1 to Vdd_ro2N for the cross-coupled inverters) and individual local lower voltage rail (e.g., Vdd_ro1 to Vdd_roN for the cascaded inverters, and Vdd_roN+1 to Vdd_ro2N for the cross-coupled inverters), as in ROs 410 and 810. Alternatively, sets of inverters 910-1, 910-5, 910-1A, and 910-1B, 910-2, 910-6, 910-2A, and 910-2B, 910-3, 910-7, 910-3A, and 910-3B, and 910-4, 910-8, 910-4A, and 910-4B may be coupled between local upper voltage rails Vdd_ro1 to Vdd_ro4 and local lower voltage rails Vss_ro1 to Vss_ro4, respectively, similar to ROs 310 and 710.

Figure 10:
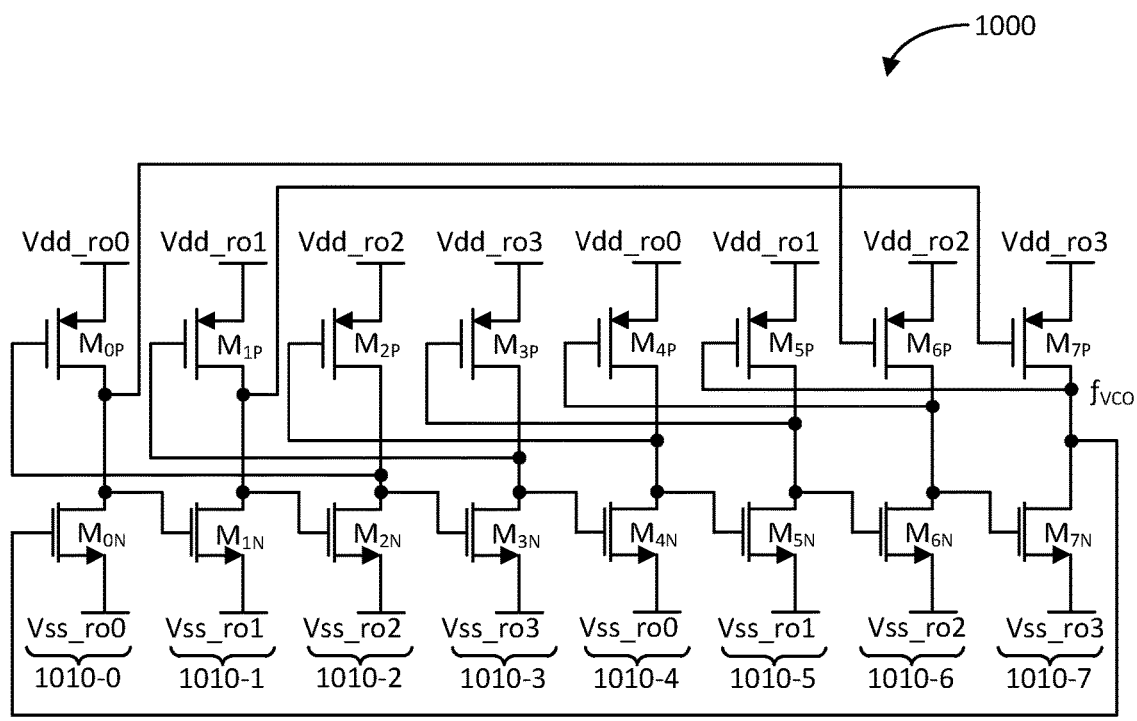
FIG. 10 illustrates a schematic diagram of another example ring oscillator (RO) in accordance with another aspect of the disclosure.

FIG. 10 illustrates a schematic diagram of another example ring oscillator (RO) 1000 in accordance with another aspect of the disclosure. The RO 1000 may be another example implementation of any of the ROs 210, 310, 410, 610, 710, and 810 previously discussed. Similarly, the RO 1000 may be particularly useful for high frequency applications, such as to achieve frequencies in the vicinity of 16 GHz. For example, the RO 1000 may have a higher frequency performance than a standard RO with cascaded inverters arranged in a ring.

In particular, the RO 1000 includes a set of cascaded inverters 1010-0 to 1010-7 arranged in a ring. In this example, there are eight (8) inverters in the set of cascaded inverters 1010-0 to 1010-7, but it shall be understood that the RO 1000 may be implemented with a different number of cascaded inverters. The set of cascaded inverters 1010-0 to 1010-7 include PMOS FETs $M_{0P}$ to $M_{7P}$ coupled in series with NMOS FETs $M_{0N}$ to $M_{7N}$ between at least one upper voltage rail Vdd_rox and at least one lower voltage rail Vss_rox, respectively. The upper voltage rail Vdd_rox and lower voltage rail Vss_rox may be a local upper voltage rail Vdd_ro and a local lower voltage rail Vss_ro, as in ROs 210, and 610, respectively. Alternatively, the upper voltage rails Vdd_rox and lower voltage rails Vss_rox may be individual local upper voltage rails (e.g., Vdd_ro0 to Vdd_ro7) and individual local lower voltage rails (e.g., Vss_ro0 to Vss_ro7) for the inverters 1010-0 to 1010-7, respectively, as in ROs 410 and 810. Alternatively, as shown, pairs of inverters 1010-0/1010-4, 1010-1/1010-5, 1010-2/1010-6, and 1010-3/1010-7 may be coupled between local upper voltage rails Vdd_ro0 to Vdd_ro3 and local lower voltage rails Vss_ro0 to Vss_ro3, respectively, similar to ROs 310 and 710.

The gates of the NMOS FETs $M_{0N}$ to $M_{7N}$ of the set of cascaded inverters 1010-0 to 1010-7 are coupled to outputs of the immediately preceding inverters 1010-7 to 1010-6 in a round robin or modulo-8 (mod 8) manner, respectively. In general, for a set of N cascaded inverters 1010-0 to 1010-(N−1), the gate of the $i^{th}$ NMOS FET is coupled to the output of the (i−1)mod $N^{th}$ inverter for i=0 to N−1. The gates of the PMOS FETs $M_{0P}$ to $M_{7P}$ of the set of inverters 1010-0 to 1010-7 are coupled to outputs of the second following inverters 1010-2 to 1010-1 in a round robin or mod 8 manner, respectively. In general, for a set of N cascaded inverters 1010-0 to 1010-(N−1), the gate of the $i^{th}$ PMOS FET is coupled to the output of the (i+2)mod $N^{th}$ inverter for i=0 to N−1. Such skewed delay RO 1000 improves the high frequency performance of the RO.

Figure 11:
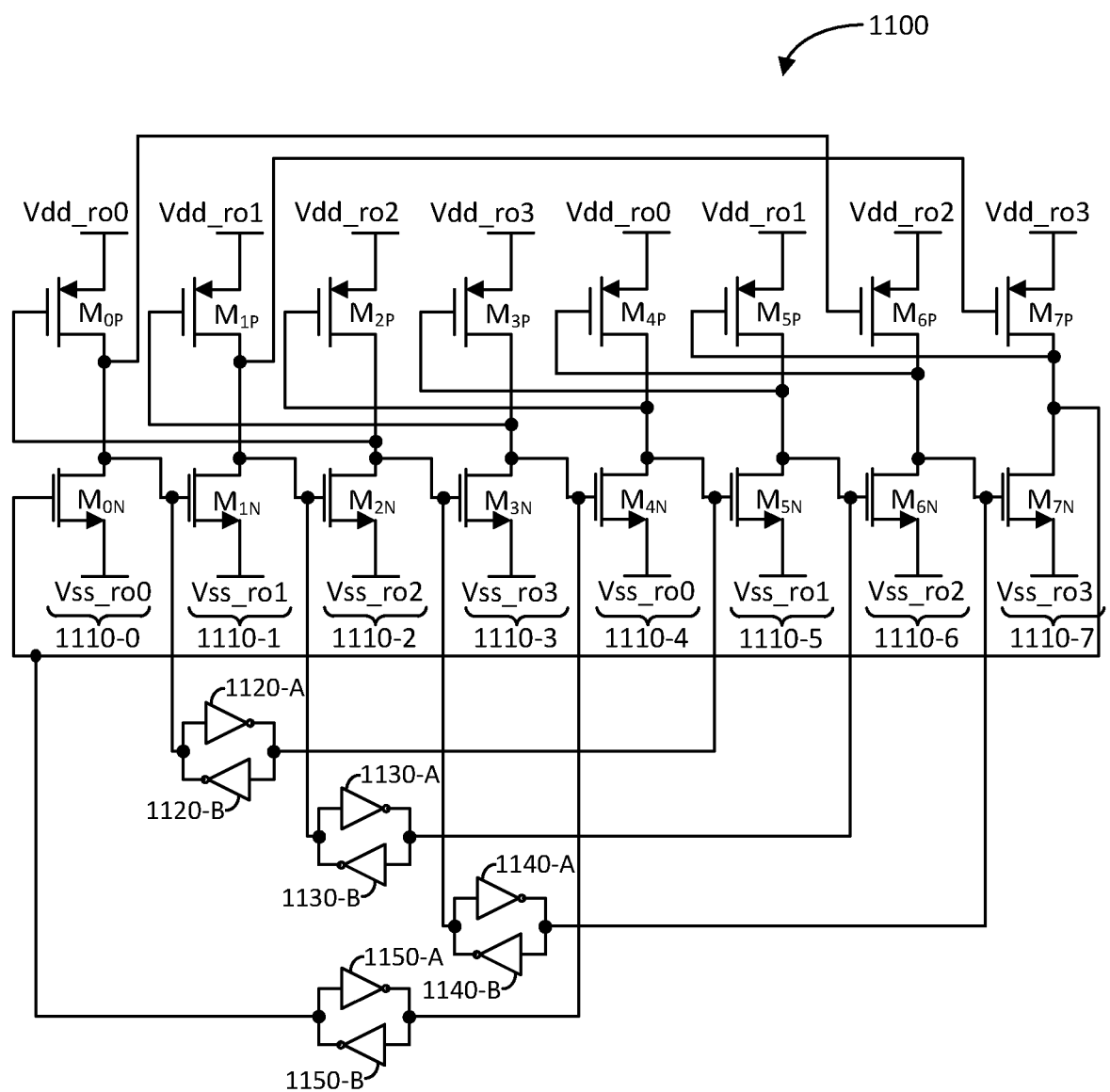
FIG. 11 illustrates a schematic diagram of another example ring oscillator (RO) in accordance with another aspect of the disclosure.

FIG. 11 illustrates a schematic diagram of another example ring oscillator (RO) 1100 in accordance with another aspect of the disclosure. The RO 1100 may be another example implementation of any of the ROs 210, 310, 410, 610, 710, and 810 previously discussed. Similarly, the RO 1100 may be particularly useful for high frequency applications, such as to achieve frequencies in the vicinity of 16 GHz. For example, the RO 1100 may have a higher frequency performance than a standard RO with cascaded inverters arranged in a ring. The RO 1100 may be a variation of RO 1000 with the addition of cross-coupled inverters as in RO 900.

In particular, the RO 1100 includes a set of cascaded inverters 1110-0 to 1110-7 arranged to form a ring. In this example, there are eight (8) inverters in the set of cascaded inverters 1110-0 to 1110-7, but it shall be understood that the RO 1100 may be implemented with a different number of cascaded inverters. The set of cascaded inverters 1110-0 to 1110-7 include PMOS FETs $M_{0P}$ to $M_{7P}$ coupled in series with NMOS FETs $M_{0N}$ to $M_{7N}$ between at least one upper voltage rail Vdd_rox and at least one lower voltage rail Vss_rox, respectively. The upper voltage rail Vdd_rox and lower voltage rail Vss_rox may be a local upper voltage rail Vdd_ro and a local lower voltage rail Vss_ro, as in ROs 210, and 610, respectively. Alternatively, the upper voltage rails Vdd_rox and lower voltage rails Vss_rox may be individual upper voltage rails (e.g., Vdd_ro0 to Vdd_ro7) and individual lower voltage rails (e.g., Vss_ro0 to Vss_ro7) for the inverters 1110-0 to 1110-7, respectively, as in ROs 410 and 810. Alternatively, as shown, pairs of inverters 1110-0/1110-4, 1110-1/1110-5, 1110-2/1110-6, and 1110-3/1110-7 may be coupled between local upper voltage rails Vdd_ro0 to Vdd_ro3 and local lower voltage rails Vss_ro0 to Vss_ro3, respectively, similar to ROs 310 and 710.

The gates of the NMOS FETs $M_{0N}$ to $M_{7N}$ of the set of cascaded inverters 1110-0 to 1110-7 are coupled to outputs of the immediately preceding inverters 1110-7 to 1110-6 in a round robin or modulo-8 (mod 8) manner, respectively. In general, for a set of N cascaded inverters 1110-0 to 1110-(N−1), the gate of the it NMOS FET is coupled to the output of the (i−1)mod $N^{th}$ inverter for i=0 to N−1. The gates of the PMOS FETs $M_{0P}$ to $M_{7P}$ of the set of inverters 1110-0 to 1110-7 are coupled to outputs of the second following inverters 1110-2 to 1110-1 in a round robin or mod 8 manner, respectively. In general, for a set of N cascaded inverters 1110-0 to 1110-(N−1), the gate of the $i^{th}$ PMOS FET is coupled to the output of the (i+2)mod $N^{th}$ inverter for i=0 to N−1. Such skewed delay RO 1100 improves the high frequency performance of the RO.

For further improvement of the high frequency performance of the RO 1100, the RO 1100 includes cross-coupled inverters 1120-A/1120-B, 1130-A/1130-B, 1140-A/1140-B, and 1150-A/1150-B. The cross-coupled inverters 1120-A/1120-B are coupled across the outputs of inverters 1110-0 and 1110-4. The cross-coupled inverters 1130-A/1130-B are coupled across the outputs of inverters 1110-1 and 1110-5. The cross-coupled inverters 1140-A/1140-B are coupled across the outputs of inverters 1110-2 and 1110-6. The cross-coupled inverters 1150-A/1150-B are coupled across the outputs of inverters 1110-3 and 1110-7. In general, for a set of N cascaded inverters 1110-0 to 1110-(N−1), the $i^{th}$ cross-coupled inverters are coupled across the outputs of the $i^{th}$ and (i+N/2)mod $N^{th}$ inverters for i=0 to N/2.

The cross-coupled inverters 1120-A/1120-B, 1130-A/1130-B, 1140-A/1140-B, and 1150-A/1150-B may be coupled between a local upper voltage rail Vdd_ro and a local lower voltage rail Vss_ro, as in ROs 210 and 610. Alternatively, the cross-coupled inverters 1120-A/1120-B, 1130-A/1130-B, 1140-A/1140-B, and 1150-A/1150-B may each be coupled between individual local upper voltage rail (e.g., Vdd_ro0 to Vdd_ro7) and individual lower voltage rail (e.g., Vss_ro0 to Vss_ro7). Alternatively, cross-coupled inverters 1120-A/1120-B, 1130-A/1130-B, 1140-A/1140-B, and 1150-A/1150-B may be coupled between local upper voltage rails Vdd_ro0 to Vdd_ro3 and local lower voltage rails Vss_ro0 to Vss_ro3, respectively.

Figure 12:
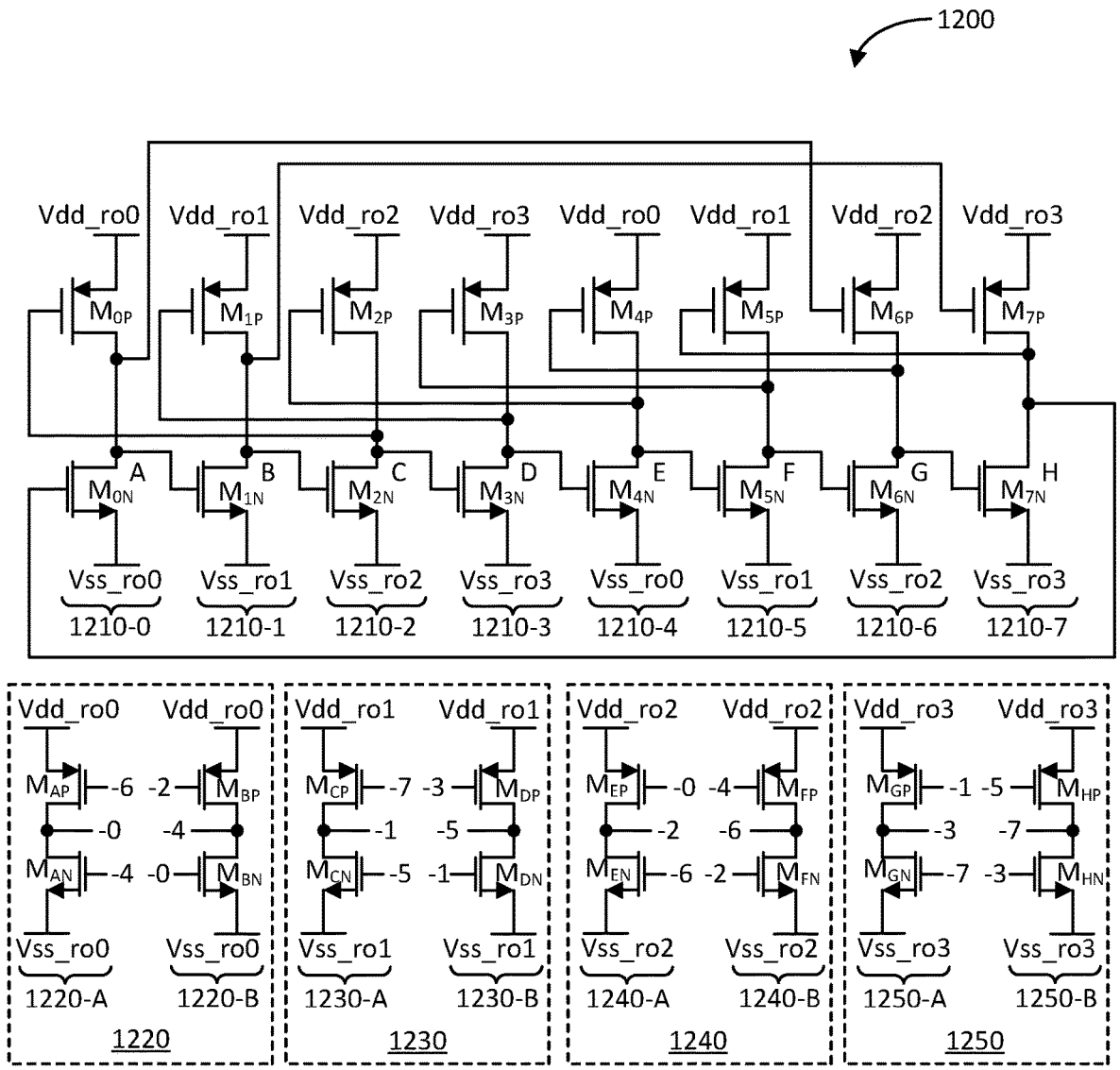
FIG. 12 illustrates a schematic diagram of another example ring oscillator (RO) in accordance with another aspect of the disclosure.

FIG. 12 illustrates a schematic diagram of another example ring oscillator (RO) 1200 in accordance with another aspect of the disclosure. The RO 1200 may be another example implementation of any of the ROs 210, 310, 410, 610, 710, and 810 previously discussed. Similarly, the RO 1200 may be particularly useful for high frequency applications, such as to achieve frequencies in the vicinity of 16 GHz. For example, the RO 1200 may have a higher frequency performance than a standard RO with cascaded inverters arranged in a ring. The RO 1200 may be a variation of RO 1100 with the addition of skewed cross-coupled inverters.

In particular, the RO 1200 includes a set of cascaded inverters 1210-0 to 1210-7 arranged to form a ring. In this example, there are eight (8) inverters in the set of cascaded inverters 1210-0 to 1210-7, but it shall be understood that the RO 1200 may be implemented with a different number of cascaded inverters. The set of cascaded inverters 1210-0 to 1210-7 include PMOS FETs $M_{0P}$ to $M_{7P}$ coupled in series with NMOS FETs $M_{0N}$ to $M_{7N}$ between at least one upper voltage rail Vdd_rox and at least one lower voltage rail Vss_rox, respectively. The upper voltage rail Vdd_rox and lower voltage rail Vss_rox may be a local upper voltage rail Vdd_ro and a local lower voltage rail Vss_ro, as in ROs 210 and 610, respectively. Alternatively, the upper voltage rails Vdd_rox and lower voltage rails Vss_rox may be individual local upper voltage rails (e.g., Vdd_ro0 to Vdd_ro7) and individual local lower voltage rails (e.g., Vss_ro0 to Vss_ro7) for the inverters 1210-0 to 1210-7, respectively, as in ROs 410 and 810. Alternatively, as shown, pairs of inverters 1210-0/1210-4, 1210-1/1210-5, 1210-2/1210-6, and 1210-3/1210-7 may be coupled between local upper voltage rails Vdd_ro0 to Vdd_ro3 and local lower voltage rails Vss_ro0 to Vss_ro3, respectively, similar to ROs 310 and 710.

The gates of the NMOS FETs $M_{0N}$ to $M_{7N}$ of the set of cascaded inverters 1210-0 to 1210-7 are coupled to outputs of the immediately preceding inverters 1210-7 to 1210-6 in a round robin or mod 8 manner, respectively. In general, for a set of N cascaded inverters 1210-0 to 1210-(N−1), the gate of the $i^{th}$ NMOS FET is coupled to the output of the (i−1)mod $N^{th}$ inverter for i=0 to N−1. The gates of the PMOS FETs $M_{0P}$ to $M_{7P}$ of the set of inverters 1210-0 to 1210-7 are coupled to outputs of the second following inverters 1210-2 to 1210-1 in a round robin or mod 8 manner, respectively. In general, for a set of N cascaded inverters 1210-0 to 1210-(N−1), the gate of the it PMOS FET is coupled to the output of the (i+2)mod $N^{th}$ inverter for i=0 to N−1. Such skewed delay RO 1200 improves the high frequency performance of the RO.

For further improvement of its the high frequency performance, the RO 1200 includes cross-coupled inverters 1220, 1230, 1240, and 1250. The cross-coupled inverter 1220 includes a first inverter 1220-A including a PMOS FET $M_{AP}$ coupled in series with an NMOS FET $M_{AN}$ between upper voltage rail Vdd_rox and lower voltage rail Vss_rox.

The cross-coupled inverter 1220 further includes a second inverter 1220-B including a PMOS FET $M_{BP}$ coupled in series with an NMOS FET $M_{BN}$ between upper voltage rail Vdd_rox and lower voltage rail Vss_rox. The cross-coupled inverter 1230 includes a first inverter 1230-A including a PMOS FET $M_{CP}$ coupled in series with an NMOS FET $M_{CN}$ between upper voltage rail Vdd_rox and lower voltage rail Vss_rox. The cross-coupled inverter 1230 further includes a second inverter 1230-B including a PMOS FET $M_{DP}$ coupled in series with an NMOS FET $M_{DN}$ between upper voltage rail Vdd_rox and lower voltage rail Vss_rox.

The cross-coupled inverter 1240 includes a first inverter 1240-A including a PMOS FET $M_{EP}$ coupled in series with an NMOS FET $M_{EN}$ between upper voltage rail Vdd_rox and lower voltage rail Vss_rox. The cross-coupled inverter 1240 further includes a second inverter 1240-B including a PMOS FET $M_{FP}$ coupled in series with an NMOS FET $M_{FN}$ between upper voltage rail Vdd_rox and lower voltage rail Vss_rox. The cross-coupled inverter 1250 includes a first inverter 1250-A including a PMOS FET $M_{GP}$ coupled in series with an NMOS FET $M_{GN}$ between upper voltage rail Vdd_rox and lower voltage rail Vss_rox. The cross-coupled inverter 1250 further includes a second inverter 1250-B including a PMOS FET $M_{HP}$ coupled in series with an NMOS FET $M_{HN}$ between upper voltage rail Vdd_rox and lower voltage rail Vss_rox.

The cross-coupled inverters 1220, 1230, 1240, and 1250 may be coupled between a local upper voltage rail Vdd_ro and a local lower voltage rail Vss_ro, as in ROs 210 and 610. Alternatively, the first and second inverters 1220A/1220B, 1230A/1230B, 1240A/1240B, and 1250A/1250B of the cross-coupled inverters 1220, 1230, 1240, and 1250 may be coupled between individual local upper voltage rails (e.g., Vdd_ro0 to Vdd_ro7) and individual local lower voltage rails (e.g., Vss_ro0 to Vss_ro7), respectively. Alternatively, as shown, cross-coupled inverters 1220, 1230, 1240, and 1250 may be coupled between local upper voltage rails Vdd_ro0 to Vdd_ro3 and local lower voltage rails Vss_ro0 to Vss_ro3, respectively.

With regard to the first cross-coupled inverter 1220: the gate of the PMOS FET $M_{AP}$ of the first inverter 1220-A is coupled to the output of cascaded inverter 1210-6; the gate of the NMOS FET $M_{AN}$ of the first inverter 1220-A is coupled to the output of cascaded inverter 1210-4; the output (at the drains of FETs $M_{AP}$ and $M_{AN}$) of the first inverter 1220-A is coupled to the output of the cascaded inverter 1210-0 (as well as the gate of the NMOS FET $M_{BN}$ of the second inverter 1220-B for cross coupling); the gate of the PMOS FET $M_{BP}$ of the second inverter 1220-B is coupled to the output of cascaded inverter 1210-2; the gate of the NMOS FET $M_{BN}$ of the second inverter 1220-B is coupled to the output of cascaded inverter 1210-0; and the output (at the drains of FETs $M_{BP}$ and $M_{BN}$) of the second inverter 1220-B is coupled to the output of the cascaded inverter 1210-4 (as well as the gate of the NMOS FET $M_{AN}$ of the first inverter 1220-A for cross coupling).

With regard to the second cross-coupled inverter 1230: the gate of the PMOS FET $M_{CP}$ of the first inverter 1230-A is coupled to the output of cascaded inverter 1210-7; the gate of the NMOS FET $M_{CN}$ of the first inverter 1230-A is coupled to the output of cascaded inverter 1210-5; the output (at the drains of FETs $M_{CP}$ and $M_{CN}$) of the first inverter 1230-A is coupled to the output of the cascaded inverter 1210-1 (as well as the gate of the NMOS FET $M_{DN}$ of the second inverter 1230-B for cross coupling); the gate of the PMOS FET $M_{DP}$ of the second inverter 1230-B is coupled to the output of cascaded inverter 1210-3; the gate of the NMOS FET $M_{DN}$ of the second inverter 1230-B is coupled to the output of cascaded inverter 1210-1; and the output (at the drains of FETs $M_{DP}$ and $M_{DN}$) of the second inverter 1230-B is coupled to the output of the cascaded inverter 1210-5 (as well as the gate of the NMOS FET $M_{CN}$ of the first inverter 1230-A for cross coupling).

With regard to the third cross-coupled inverter 1240: the gate of the PMOS FET $M_{EP}$ of the first inverter 1240-A is coupled to the output of cascaded inverter 1210-0; the gate of the NMOS FET $M_{EN}$ of the first inverter 1240-A is coupled to the output of cascaded inverter 1210-6; the output (at the drains of FETs $M_{EP}$ and $M_{EN}$) of the first inverter 1240-A is coupled to the output of the cascaded inverter 1210-2 (as well as the gate of the NMOS FET $M_{FN}$ of the second inverter 1240-B for cross coupling); the gate of the PMOS FET $M_{FP}$ of the second inverter 1240-B is coupled to the output of cascaded inverter 1210-4; the gate of the NMOS FET $M_{FN}$ of the second inverter 1240-B is coupled to the output of cascaded inverter 1210-2; and the output (at the drains of FETs $M_{FP}$ and $M_{FN}$) of the second inverter 1240-B is coupled to the output of the cascaded inverter 1210-6 (as well as the gate of the NMOS FET $M_{EN}$ of the first inverter 1240-A for cross coupling).

With regard to the fourth cross-coupled inverter 1250: the gate of the PMOS FET $M_{GP}$ of the first inverter 1250-A is coupled to the output of cascaded inverter 1210-1; the gate of the NMOS FET $M_{GN}$ of the first inverter 1250-A is coupled to the output of cascaded inverter 1210-7; the output (at the drains of FETs $M_{GP}$ and $M_{GN}$) of the first inverter 1250-A is coupled to the output of the inverter 1210-3 (as well as the gate of the NMOS FET $M_{HN}$ of the second inverter 1250-B for cross coupling); the gate of the PMOS FET $M_{HP}$ of the second inverter 1250-B is coupled to the output of cascaded inverter 1210-5; the gate of the NMOS FET $M_{HN}$ of the second inverter 1250-B is coupled to the output of cascaded inverter 1210-3; and the output (at the drains of FETs $M_{HP}$ and $M_{HN}$) of the second inverter 1250-B is coupled to the output of the inverter 1210-7 (as well as the gate of the NMOS FET $M_{GN}$ of the first inverter 1250-A for cross coupling).

In a general sense for such an RO 1200 with a set of N cascaded inverters arranged in a ring, where N is an even integer, the $i^{th}$ cross-coupled inverter (from i=0 to (N/2)−1) includes a first inverter: with a PMOS FET including a gate coupled to the output of the (i+N/2+2)mod $N^{th}$ inverter, an NMOS FET including a gate coupled to the output of the (i+N/2)mod $N^{th}$ inverter, an output (at the drains of the PMOS and NMOS FETs) coupled the output of the $i^{th}$ inverter (or gate of the NMOS FET of the second inverter of the $i^{th}$ cross-coupled inverter); and a second inverter: with a PMOS FET including a gate coupled to the output of the (i+2)mod $N^{th}$ inverter, an NMOS FET including a gate coupled to the output of the $i^{th}$ inverter, an output (at the drains of the PMOS and NMOS FETs) coupled the output of the (i+N/2)mod $N^{th}$ inverter (or gate of the NMOS FET of the first inverter of the $i^{th}$ cross-coupled inverter).

Figure 13:
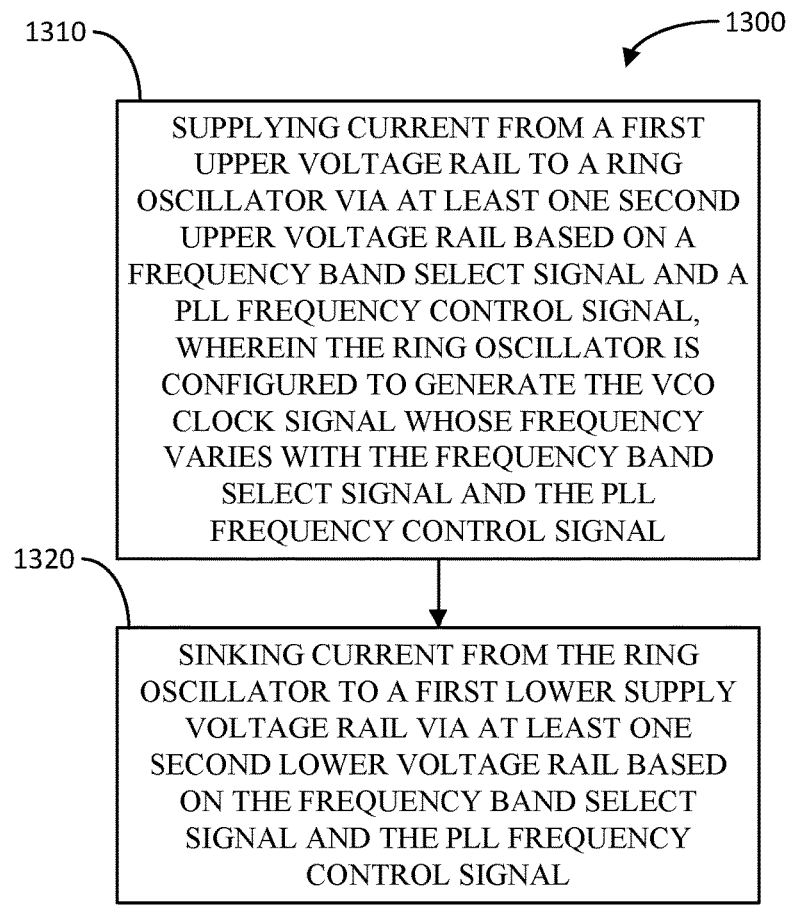
FIG. 13 illustrates a flow diagram of an example method of generating a voltage controlled oscillator (VCO) clock signal in accordance with another aspect of the disclosure.

FIG. 13 illustrates a flow diagram of an example method 1300 of generating voltage controlled oscillator (VCO) clock signal in accordance with another aspect of the disclosure.

The method 1300 includes supplying current from a first upper voltage rail to a ring oscillator via at least one second upper voltage rail based on a frequency band select signal and a PLL frequency control signal, wherein the ring oscillator is configured to generate the VCO clock signal whose frequency varies with the frequency band select signal and the PLL frequency control signal (block 1310). Examples of means for supplying current from a first upper voltage rail to a ring oscillator via at least one second upper voltage rail based on a frequency band select signal and a PLL frequency control signal include any of the first band select circuits and first VCO frequency control circuits described herein.

The method 1300 further includes sinking current from the ring oscillator to a first lower supply voltage rail via at least one second lower voltage rail based on the frequency band select signal and the PLL frequency control signal (block 1320). Examples of means for sinking current from the ring oscillator to a first lower supply voltage rail via at least one second lower voltage rail based on the frequency band select signal and the PLL frequency control signal include any of the second band select circuits and second VCO frequency control circuits described herein.

Figure 14:
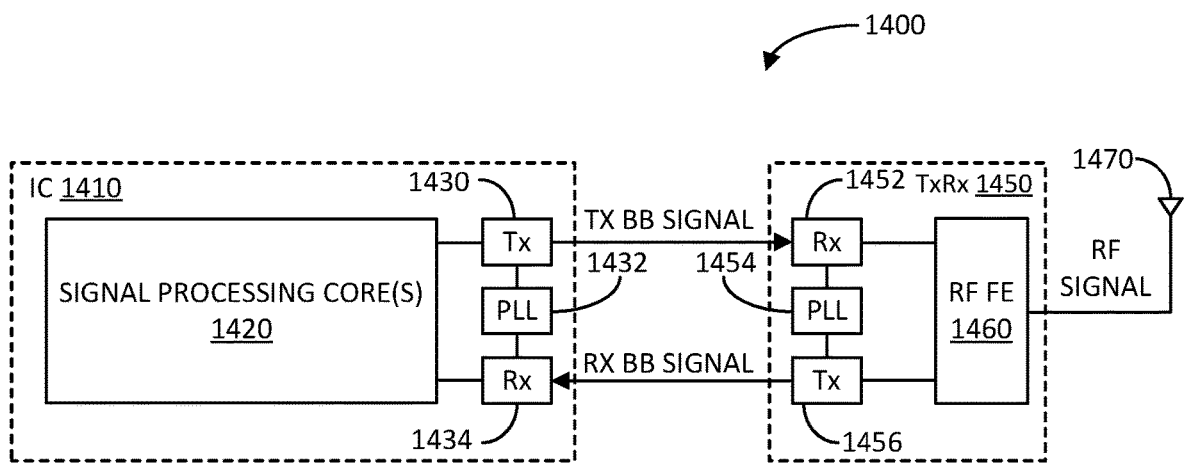
FIG. 14 illustrates a block diagram of an example wireless communication device in accordance with another aspect of the disclosure.

FIG. 14 illustrates a block diagram of an example wireless communication device 1400 in accordance with another aspect of the disclosure. The wireless communication device 1400 may be a smart phone, a desktop computer, laptop computer, tablet device, Internet of Things (IoT), wearable wireless device (e.g., wireless watch), and other types of wireless device.

In particular, the wireless communication device 1400 includes an integrated circuit (IC) 1410, which may be implemented as a system on chip (SOC). The IC 1410 includes one or more signal processing cores 1420 configured to generate a transmit (Tx) baseband (BB) signal and process a received (Rx) baseband (BB) signal. The IC 1410 further includes a data transmitter (Tx) 1430, at least one phase lock loop (PLL) 1432, and a data receiver (RX) 1434. The data Tx 1430 may be configured to transmit the Tx BB signal based on a clock signal generated by the at least one PLL 1432. Similarly, the data Rx 1434 may be configured to receive the Rx BB signal based on a clock signal generated by the at least one PLL 1432. The at least one PLL 1432 may be implemented per PLL 100 and may include clock and data recovery (CDR) components per CDR 500, both of which may include any of the VCOs described herein.

The wireless communication device 1400 may further include a transceiver (Tx/Rx) 1450 including a data receiver (Rx) 1452, at least one phase lock loop (PLL) 1454, a data transmitter (Tx) 1456, and a radio frequency front end (RF EN) 1460. The data Rx 1452 may be configured to receive the Tx BB signal based on a clock signal generated by the at least one PLL 1454. The data Tx 1456 may be configured to transmit the Rx BB signal based on a clock signal generated by the at least one PLL 1454. The at least one PLL 1454 may be implemented per PLL 100 and may include clock and data recovery (CDR) components per CDR 500, both of which may include any of the VCOs described herein.

The RF EN 1460 is configured to convert the Tx BB signal into a transmit (Tx) radio frequency (RF) signal, and convert a received (Rx) RF signal into the Rx BB signal. The Tx/Rx 1450 is coupled to the at least one antenna 1470 to provide thereto the Tx RF signal for electromagnetic radiation into a wireless medium for wireless transmission, and receive the Rx RF signal electromagnetically picked up from the wireless medium by the at least one antenna 1470.

The following provides an overview of aspects of the present disclosure:

Aspect 1: An apparatus, comprising: a first upper voltage rail; a first lower voltage rail; and a voltage controlled oscillator (VCO), comprising: at least one second upper voltage rail; at least one second lower voltage rail; a ring oscillator (RO) including a set of N cascaded inverters arranged in a ring, wherein the set of N cascaded inverters are coupled between the at least one second upper voltage rail and the at least one second lower voltage rail, wherein N is a positive integer number; at least one first frequency band select circuit coupled between the first upper voltage rail and the at least one second upper voltage rail, respectively; at least one second frequency band select circuit coupled between the at least one second lower voltage rail and the first lower voltage rail, respectively; at least one first VCO frequency control circuit coupled between the first upper voltage rail and the at least one second upper voltage rail, respectively; and at least one second VCO frequency control circuit coupled between the at least one second lower voltage rail and the first lower voltage rail, respectively.

Aspect 2: The apparatus of aspect 1, wherein: the at least one second upper voltage rail comprises a set of N/2 upper voltage rails; the at least one second lower voltage rail comprises a set of N/2 lower voltage rails; and pairs of the set of N cascaded inverters are coupled between the set of N/2 upper voltage rails and the set of N/2 lower voltage rails, respectively.

Aspect 3: The apparatus of aspect 2, wherein: the at least one first frequency band select circuit comprises a first set of N/2 frequency band select circuits coupled between the first upper voltage rail and the set of N/2 upper voltage rails, respectively; and the at least one second frequency band select circuit comprises a second set of N/2 frequency band select circuits coupled between the set of N/2 lower voltage rails and the first lower voltage rail, respectively.

Aspect 4: The apparatus of aspect 2 or 3, wherein: the at least one first VCO frequency control circuit comprises a first set of N/2 VCO frequency control circuits coupled between the first upper voltage rail and the set of N/2 upper voltage rails, respectively; and the at least one second VCO frequency control circuit comprises a second set of N/2 VCO frequency control circuits coupled between the set of N/2 lower voltage rails and the first lower voltage rail, respectively.

Aspect 5: The apparatus of any one of aspects 1-4, wherein: each of the at least one first frequency band select circuit comprises a current source configured to supply current to the RO based on a band select signal; and each of the at least one second frequency band select circuit comprises a current sink configured to sink current from the RO based on the band select signal.

Aspect 6: The apparatus of any one of aspects 1-5, wherein: each of the at least one first frequency band select circuit comprises a first set of switching devices configured to selectively couple the first upper voltage rail to the at least one second upper voltage rail based on a band select signal; and each of the at least one second frequency band select circuit comprises a second set of switching devices configured to selectively couple the at least one second lower voltage rail to the first lower voltage rail based on the band select signal.

Aspect 7: The apparatus of any one of aspects 1-6, wherein: each of the at least one first VCO frequency control circuit comprises at least one current source configured to supply current to the RO based on a PLL frequency control signal; and each of the at least one second VCO frequency control circuit comprises at least one current sink configured to sink current from the RO based on the PLL frequency control signal.

Aspect 8: The apparatus of any one of aspects 1-7, wherein: each of the at least one first VCO frequency control circuit comprises at least one current source configured to supply current to the RO based on a PLL frequency control signal; and each of the at least one second VCO frequency control circuit comprises at least one current sink configured to sink current from the RO based on the PLL frequency control signal.

Aspect 9: The apparatus of aspect 8, wherein: the at least one current source comprises a set of current sources; each of the at least one first VCO frequency control circuit comprises a first set of switching devices, wherein the set of current sources are configured to receive the PLL frequency control signal via the first set of switching devices based on a kvco control signal, respectively; the at least one current sink comprises a set of current sinks; and each of the at least one second VCO frequency control circuit comprises a second set of switching devices, wherein the set of current sinks are configured to receive the PLL frequency control signal via the second set of switching devices based on the kvco control signal, respectively.

Aspect 10: The apparatus of any one of aspects 1-9, further comprising: a phase-frequency detector configured to generate a phase error signal based on a phase difference between a reference clock signal and a feedback clock signal; a charge pump configured to generate a control signal based on the phase error signal; a loop filter configured to filter the control signal to generate a PLL frequency control signal that controls the at least one first VCO frequency control circuit and the at least one second VCO control circuit such that the VCO generates a VCO clock signal whose frequency is based on the PLL frequency control signal; and a frequency divider configured to generate the feedback clock signal based on the VCO clock signal.

Aspect 11: The apparatus of any one of aspects 1-10, wherein the VCO further comprises: at least one first data phase alignment circuit coupled between the first upper voltage rail and the at least one second upper voltage rail, respectively; and at least one second data phase alignment circuit coupled between the at least one second lower voltage rail and the first lower voltage rail, respectively.

Aspect 12: The apparatus of aspect 11, wherein: the at least one second upper voltage rail comprises a set of N/2 upper voltage rails; the at least one second lower voltage rail comprises a set of N/2 lower voltage rails; pairs of the set of N cascaded inverters are coupled between the set of N/2 upper voltage rails and the set of N/2 lower voltage rails, respectively; the at least one first data phase alignment circuit comprises a first set of N/2 data phase alignment circuits coupled between the first upper voltage rail and the set of N/2 upper voltage rails, respectively; and the at least one second data phase alignment circuit comprises a second set of N/2 data phase alignment circuits coupled between the set of N/2 lower voltage rails and the first lower voltage rail, respectively.

Aspect 13: The apparatus of aspect 11 or 12, wherein: each of the at least one first data phase alignment circuit comprises a current source configured to supply current to the RO based on a data phase alignment control signal; and each of the at least one second data phase alignment circuit comprises a current sink configured to sink current from the RO based on the data phase alignment control signal.

Aspect 14: The apparatus of aspect 13, wherein: the current source comprises a set of selectable current sources configured to selectively supply a controllable amount of current to the RO based on the data phase alignment control signal; and the current sink comprises a set of selectable current sinks configured to selectively sink a controllable amount of current from the RO based on the data phase alignment control signal.

Aspect 15: The apparatus of any one of aspects 11-14, further comprising: a phase-frequency detector configured to generate a phase error signal based on a phase difference between a reference clock signal and a feedback clock signal; a first charge pump configured to generate a first control signal based on the phase error signal; a data sampler configured to sample an input data signal based on a VCO clock signal generated by the VCO to generate a sampled data signal; a phase detector configured to generate a data phase alignment signal based on the sampled data signal; a second charge pump configured to generate a second control signal based on the data phase alignment signal; a loop filter configured to filter the first and second control signals to generate a PLL frequency control signal that controls the at least one first VCO frequency control circuit and the at least one second VCO frequency control circuit such that the VCO generates a VCO clock signal whose frequency is based on the PLL frequency control signal; and a frequency divider configured to generate the feedback clock signal based on the VCO clock signal.

Aspect 16: The apparatus of any one of aspects 1-15, wherein N is an even integer number, and wherein the RO further comprises a set of N/2 cross-coupled inverters, wherein each $i^{th}$ cross-coupled inverter is coupled across outputs of the $i^{th}$ and $(i+N/2)^{th}$ inverters of the set of N cascaded inverters for i=1 to N/2.

Aspect 17: The apparatus of any one of aspects 1-15, wherein the each of the set of N cascaded inverter comprises a p-channel metal oxide semiconductor field effect transistor (PMOS FET) coupled in series with an n-channel metal oxide semiconductor field effect transistor (NMOS FET) between the at least one second upper voltage rail and the at least one second lower voltage rail, wherein each it PMOS FET includes a gate coupled to an output of the $(i+2) \bmod N^{th}$ inverter of the set of N cascaded inverters for i=0 to N−1, and wherein each $i^{th}$ NMOS FET includes a gate coupled to an output of the $(i−1) \bmod N^{th}$ inverter of the set of N cascaded inverters for i=0 to N−1.

Aspect 18: The apparatus of aspect 17, wherein N is an even integer number, and wherein the RO further comprises a set of N/2 cross-coupled inverters, wherein each $i^{th}$ cross-coupled inverter is coupled across outputs of the $i^{th}$ and $(i+(N/2)−1) \bmod N^{th}$ inverters for i=0 to (N/2)−1.

Aspect 19: The apparatus of aspect 17, wherein N is an even integer number, wherein the RO further comprises a set of N/2 cross-coupled inverters, wherein each of the set of N/2 cross-coupled inverters comprises: a first inverter including a first PMOS FET coupled in series with a first NMOS FET between the at least one second upper voltage rail and the at least one second lower voltage rail; and a second inverter including a second PMOS FET coupled in series with a second NMOS FET between the at least one second upper voltage rail and the at least one second lower voltage rail; wherein each it first PMOS FET includes a gate coupled to the output of the $(i+N/2+2) \bmod N^{th}$ inverter, wherein each $i^{th}$ first NMOS FET includes a gate coupled to the output of the $(i+N/2) \bmod N^{th}$ inverter, wherein each $i^{th}$ second PMOS FET includes a gate coupled to the output of the $(i+2) \bmod N^{th}$ inverter, wherein each $i^{th}$ second NMOS FET includes a gate coupled to the output of the $i^{th}$ inverter, wherein drains of each $i^{th}$ first PMOS FET and each $i^{th}$ first NMOS FET is coupled to the gate of each $i^{th}$ second NMOS FET, and wherein drains of each $i^{th}$ second PMOS FET and each $i^{th}$ second NMOS FET is coupled to the gate of each $i^{th}$ first NMOS FET, for i=0 to (N/2)−1.

Aspect 20: The apparatus of any one of aspects 1-19, wherein the ring oscillator (RO) further comprises a set of variable capacitors coupled between outputs of the set of N cascaded inverters and the first lower voltage rail or the at least one second lower voltage rail, the set of variable capacitors each include a capacitance varied in accordance with a band select signal, respectively.

Aspect 21: A method of generating a voltage controlled oscillator (VCO) clock signal, comprising: supplying current from a first upper voltage rail to a ring oscillator via at least one second upper voltage rail based on a frequency band select signal and a PLL frequency control signal, wherein the ring oscillator is configured to generate the VCO clock signal whose frequency varies with the frequency band select signal and the PLL frequency control signal; and sinking current from the ring oscillator to a first lower supply voltage rail via at least one second lower voltage rail based on the frequency band select signal and the PLL frequency control signal.

Aspect 22: The method of aspect 21, wherein: the ring oscillator comprises a set of N cascaded inverters arranged to form a ring, wherein N is a positive integer number; the at least one second upper voltage rail comprises a set of N/2 upper voltage rails; the at least one second lower voltage rail comprises a set of N/2 lower voltage rails; supplying current from the first upper voltage rail to the ring oscillator comprises supplying a first set of currents from the first upper voltage rail to pairs of the set of N cascaded inverters via the set of N/2 upper voltage rails, respectively; and sinking current from the ring oscillator to the first lower supply voltage rail comprises sinking a second set of currents from the pairs of the set of N cascaded inverters to the first lower supply voltage rail via the set of N/2 lower voltage rails, respectively.

Aspect 23: The method of aspect 21 or 22, wherein: supplying current from the first upper voltage rail to the ring oscillator comprises supplying current based on a data phase alignment signal, the frequency of the VCO clock signal varying with the data phase alignment signal; and sinking current from the ring oscillator to the first lower supply voltage rail comprises sinking current from the ring oscillator based on the data phase alignment signal.

Aspect 24: The method of any one of aspects 21-23, wherein: the ring oscillator comprises a set of N cascaded inverters arranged to form a ring, wherein N is a positive integer number; the at least one second upper voltage rail comprises a set of N/2 upper voltage rails; the at least one second lower voltage rail comprises a set of N/2 lower voltage rails; supplying current from the first upper voltage rail to the ring oscillator comprises supplying a first set of currents from the first upper voltage rail to pairs of the set of N cascaded inverters via the set of N/2 upper voltage rails based on a data phase alignment signal, respectively; and sinking current from the ring oscillator to the first lower supply voltage rail comprises sinking a second set of currents from the pairs of the set of N cascaded inverters to the first lower supply voltage rail via the set of N/2 lower voltage rails based on the data phase alignment signal, respectively.

Aspect 25: An apparatus for generating a voltage controlled oscillator (VCO) clock signal, comprising: means for supplying current from a first upper voltage rail to a ring oscillator via at least one second upper voltage rail based on a frequency band select signal and a PLL frequency control signal, wherein the ring oscillator is configured to generate the VCO clock signal whose frequency varies with the frequency band select signal and the PLL frequency control signal; and means for sinking current from the ring oscillator to a first lower supply voltage rail via at least one second lower voltage rail based on the frequency band select signal and the PLL frequency control signal.

Aspect 26: The apparatus of aspect 25, wherein: the ring oscillator comprises a set of N cascaded inverters arranged to form a ring, wherein N is a positive integer number; the at least one second upper voltage rail comprises a set of N upper voltage rails; the at least one second lower voltage rail comprises a set of N lower voltage rails; the means for supplying current from the first upper voltage rail to the ring oscillator comprises means for supplying a first set of currents from the first upper voltage rail to the set of N cascaded inverters via the set of N upper voltage rails, respectively; and the means for sinking current from the ring oscillator to the first lower supply voltage rail comprises means for sinking a second set of currents from the set of N cascaded inverters to the first lower supply voltage rail via the set of N lower voltage rails, respectively.

Aspect 27: The apparatus of aspect 25 or 26, wherein: the means for supplying current from the first upper voltage rail to the ring oscillator comprises means for supplying current based on a data phase alignment signal, the frequency of the VCO clock signal varying with the data phase alignment signal; and the means for sinking current from the ring oscillator to the first lower supply voltage rail comprises means for sinking current from the ring oscillator based on the data phase alignment signal.

Aspect 28: The apparatus of any one of aspects 25-27, wherein: the ring oscillator comprises a set of N cascaded inverters arranged to form a ring; the at least one second upper voltage rail comprises a set of N upper voltage rails; the at least one second lower voltage rail comprises a set of N lower voltage rails; the means for supplying current from the first upper voltage rail to the ring oscillator comprises means for supplying a first set of currents from the first upper voltage rail to the set of N cascaded inverters via the set of N upper voltage rails based on a data phase alignment signal, respectively; and the means for sinking current from the ring oscillator to the first lower supply voltage rail comprises means for sinking a second set of currents from the set of N cascaded inverters to the first lower supply voltage rail via the set of N lower voltage rails based on the data phase alignment signal, respectively.

Aspect 29: A wireless communication device, comprising: at least one antenna; a transceiver coupled to the at least one antenna; an integrated circuit (IC) including one or more signal processing cores coupled to the transceiver, wherein at least one of the IC or the transceiver each comprises: a first upper voltage rail; a first lower voltage rail; and a voltage controlled oscillator (VCO), comprising: at least one second upper voltage rail; at least one second lower voltage rail; a ring oscillator (RO) including a set of N cascaded inverters arranged in a ring, wherein the set of N cascaded inverters are coupled between the at least one second upper voltage rail and the at least one second lower voltage rail, wherein N is a positive integer number; at least one first frequency band select circuit coupled between the first upper voltage rail and the at least one second upper voltage rail, respectively; at least one second frequency band select circuit coupled between the at least one second lower voltage rail and the first lower voltage rail, respectively; at least one first VCO frequency control circuit coupled between the first upper voltage rail and the at least one second upper voltage rail, respectively; and at least one second VCO frequency control circuit coupled between the at least one second lower voltage rail and the first lower voltage rail, respectively.

Aspect 30: The wireless communication device of aspect 29, wherein the VCO further comprises: at least one first data phase alignment circuit coupled between the first upper voltage rail and the at least one second upper voltage rail, respectively; and at least one second data phase alignment circuit coupled between the at least one second lower voltage rail and the first lower voltage rail, respectively.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:
1. An apparatus, comprising:
a first upper voltage rail;
a first lower voltage rail; and
a voltage controlled oscillator (VCO), comprising:
at least one second upper voltage rail;
at least one second lower voltage rail;
a ring oscillator (RO) including a set of N cascaded inverters arranged in a ring, wherein the set of N cascaded inverters are coupled between the at least one second upper voltage rail and the at least one second lower voltage rail, wherein N is a positive integer number;
at least one first frequency band select circuit coupled between the first upper voltage rail and the at least one second upper voltage rail, respectively;
at least one second frequency band select circuit coupled between the at least one second lower voltage rail and the first lower voltage rail, respectively;
at least one first VCO frequency control circuit coupled between the first upper voltage rail and the at least one second upper voltage rail, respectively; and
at least one second VCO frequency control circuit coupled between the at least one second lower voltage rail and the first lower voltage rail, respectively.

2. The apparatus of claim 1, wherein:
the at least one second upper voltage rail comprises a set of N/2 upper voltage rails;
the at least one second lower voltage rail comprises a set of N/2 lower voltage rails; and
pairs of the set of N cascaded inverters are coupled between the set of N/2 upper voltage rails and the set of N/2 lower voltage rails, respectively.

3. The apparatus of claim 2, wherein:
the at least one first frequency band select circuit comprises a first set of N/2 frequency band select circuits coupled between the first upper voltage rail and the set of N/2 upper voltage rails, respectively; and
the at least one second frequency band select circuit comprises a second set of N/2 frequency band select circuits coupled between the set of N/2 lower voltage rails and the first lower voltage rail, respectively.

4. The apparatus of claim 2, wherein:
the at least one first VCO frequency control circuit comprises a first set of N/2 VCO frequency control circuits coupled between the first upper voltage rail and the set of N/2 upper voltage rails, respectively; and
the at least one second VCO frequency control circuit comprises a second set of N/2 VCO frequency control circuits coupled between the set of N/2 lower voltage rails and the first lower voltage rail, respectively.

5. The apparatus of claim 1, wherein:
each of the at least one first frequency band select circuit comprises a current source configured to supply current to the RO based on a band select signal; and
each of the at least one second frequency band select circuit comprises a current sink configured to sink current from the RO based on the band select signal.

6. The apparatus of claim 1, wherein:
each of the at least one first frequency band select circuit comprises a first set of switching devices configured to selectively couple the first upper voltage rail to the at least one second upper voltage rail based on a band select signal; and
each of the at least one second frequency band select circuit comprises a second set of switching devices configured to selectively couple the at least one second lower voltage rail to the first lower voltage rail based on the band select signal.

7. The apparatus of claim 1, wherein:
each of the at least one first VCO frequency control circuit comprises at least one current source configured to supply current to the RO based on a PLL frequency control signal; and
each of the at least one second VCO frequency control circuit comprises at least one current sink configured to sink current from the RO based on the PLL frequency control signal.

8. The apparatus of claim 1, wherein:
each of the at least one first VCO frequency control circuit comprises at least one current source configured to supply current to the RO based on a PLL frequency control signal; and
each of the at least one second VCO frequency control circuit comprises at least one current sink configured to sink current from the RO based on the PLL frequency control signal.

9. The apparatus of claim 8, wherein:
the at least one current source comprises a set of current sources;
each of the at least one first VCO frequency control circuit comprises a first set of switching devices, wherein the set of current sources are configured to receive the PLL frequency control signal via the first set of switching devices based on a kvco control signal, respectively;
the at least one current sink comprises a set of current sinks; and
each of the at least one second VCO frequency control circuit comprises a second set of switching devices, wherein the set of current sinks are configured to receive the PLL frequency control signal via the second set of switching devices based on the kvco control signal, respectively.

10. The apparatus of claim 1, further comprising:
a phase-frequency detector configured to generate a phase error signal based on a phase difference between a reference clock signal and a feedback clock signal;
a charge pump configured to generate a control signal based on the phase error signal;
a loop filter configured to filter the control signal to generate a PLL frequency control signal that controls the at least one first VCO frequency control circuit and the at least one second VCO frequency control circuit such that the VCO generates a VCO clock signal whose frequency is based on the PLL frequency control signal; and
a frequency divider configured to generate the feedback clock signal based on the VCO clock signal.

11. The apparatus of claim 1, wherein the VCO further comprises:
at least one first data phase alignment circuit coupled between the first upper voltage rail and the at least one second upper voltage rail, respectively; and
at least one second data phase alignment circuit coupled between the at least one second lower voltage rail and the first lower voltage rail, respectively.

12. The apparatus of claim 11, wherein:
the at least one second upper voltage rail comprises a set of N/2 upper voltage rails;
the at least one second lower voltage rail comprises a set of N/2 lower voltage rails;

pairs of the set of N cascaded inverters are coupled between the set of N/2 upper voltage rails and the set of N/2 lower voltage rails, respectively;

the at least one first data phase alignment circuit comprises a first set of N/2 data phase alignment circuits coupled between the first upper voltage rail and the set of N/2 upper voltage rails, respectively; and the at least one second data phase alignment circuit comprises a second set of N/2 data phase alignment circuits coupled between the set of N/2 lower voltage rails and the first lower voltage rail, respectively.

13. The apparatus of claim 11, wherein:

each of the at least one first data phase alignment circuit comprises a current source configured to supply current to the RO based on a data phase alignment control signal; and each of the at least one second data phase alignment circuit comprises a current sink configured to sink current from the RO based on the data phase alignment control signal.

14. The apparatus of claim 13, wherein:

the current source comprises a set of selectable current sources configured to selectively supply a controllable amount of current to the RO based on the data phase alignment control signal; and the current sink comprises a set of selectable current sinks configured to selectively sink a controllable amount of current from the RO based on the data phase alignment control signal.

15. The apparatus of claim 11, further comprising:

a phase-frequency detector configured to generate a phase error signal based on a phase difference between a reference clock signal and a feedback clock signal;

a first charge pump configured to generate a first control signal based on the phase error signal;

a data sampler configured to sample an input data signal based on a VCO clock signal generated by the VCO to generate a sampled data signal;

a phase detector configured to generate a data phase alignment signal based on the sampled data signal;

a second charge pump configured to generate a second control signal based on the data phase alignment signal;

a loop filter configured to filter the first and second control signals to generate a PLL frequency control signal that controls the at least one first VCO frequency control circuit and the at least one second VCO frequency control circuit such that the VCO generates a VCO clock signal whose frequency is based on the PLL frequency control signal; and a frequency divider configured to generate the feedback clock signal based on the VCO clock signal.

16. The apparatus of claim 1, wherein N is an even integer number, and wherein the RO further comprises a set of N/2 cross-coupled inverters, wherein each $i^{th}$ cross-coupled inverter is coupled across outputs of the $i^{th}$ and $(i+N/2)^{th}$ inverters of the set of N cascaded inverters for i=1 to N/2.

17. The apparatus of claim 1, wherein the each of the set of N cascaded inverter comprises a p-channel metal oxide semiconductor field effect transistor (PMOS FET) coupled in series with an n-channel metal oxide semiconductor field effect transistor (NMOS FET) between the at least one second upper voltage rail and the at least one second lower voltage rail, wherein each $i^{th}$ PMOS FET includes a gate coupled to an output of the (i+2)mod $N^{th}$ inverter of the set of N cascaded inverters for i=0 to N−1, and wherein each $i^{th}$ NMOS FET includes a gate coupled to an output of the (i−1)mod $N^{th}$ inverter of the set of N cascaded inverters for i=0 to N−1.

18. The apparatus of claim 17, wherein N is an even integer number, and wherein the RO further comprises a set of N/2 cross-coupled inverters, wherein each $i^{th}$ cross-coupled inverter is coupled across outputs of the $i^{th}$ and (i+N/2)mod $N^{th}$ inverters for i=0 to (N/2)−1.

19. The apparatus of claim 17, wherein N is an even integer number, wherein the RO further comprises a set of N/2 cross-coupled inverters, wherein each of the set of N/2 cross-coupled inverters comprises:

a first inverter including a first PMOS FET coupled in series with a first NMOS FET between the at least one second upper voltage rail and the at least one second lower voltage rail; and a second inverter including a second PMOS FET coupled in series with a second NMOS FET between the at least one second upper voltage rail and the at least one second lower voltage rail;

wherein each $i^{th}$ first PMOS FET includes a gate coupled to the output of the (i+N/2+2)mod $N^{th}$ inverter, wherein each $i^{th}$ first NMOS FET includes a gate coupled to the output of the (i+N/2)mod $N^{th}$ inverter, wherein each $i^{th}$ second PMOS FET includes a gate coupled to the output of the (i+2)mod $N^{th}$ inverter, wherein each $i^{th}$ second NMOS FET includes a gate coupled to the output of the $i^{th}$ inverter, wherein drains of each $i^{th}$ first PMOS FET and each $i^{th}$ first NMOS FET is coupled to the gate of each $i^{th}$ second NMOS FET, and wherein drains of each $i^{th}$ second PMOS FET and each $i^{th}$ second NMOS FET is coupled to the gate of each $i^{th}$ first NMOS FET, for i=0 to (N/2)−1.

20. The apparatus of claim 1, wherein the ring oscillator (RO) further comprises a set of variable capacitors coupled between outputs of the set of N cascaded inverters and the first lower voltage rail or the at least one second lower voltage rail, the set of variable capacitors each include a capacitance varied in accordance with a band select signal, respectively.

21. A method of generating a voltage controlled oscillator (VCO) clock signal, comprising:

supplying current from a first upper voltage rail to a ring oscillator via at least one second upper voltage rail based on a frequency band select signal and a PLL frequency control signal, wherein the ring oscillator is configured to generate the VCO clock signal whose frequency varies with the frequency band select signal and the PLL frequency control signal; and sinking current from the ring oscillator to a first lower supply voltage rail via at least one second lower voltage rail based on the frequency band select signal and the PLL frequency control signal.

22. The method of claim 21, wherein:

the ring oscillator comprises a set of N cascaded inverters arranged to form a ring, wherein N is a positive integer number;

the at least one second upper voltage rail comprises a set of N/2 upper voltage rails;

the at least one second lower voltage rail comprises a set of N/2 lower voltage rails;

supplying current from the first upper voltage rail to the ring oscillator comprises supplying a first set of currents from the first upper voltage rail to pairs of the set of N cascaded inverters via the set of N/2 upper voltage rails, respectively; and sinking current from the ring oscillator to the first lower supply voltage rail comprises sinking a second set of currents from the pairs of the set of N cascaded inverters to the first lower supply voltage rail via the set of N/2 lower voltage rails, respectively.

23. The method of claim 21, wherein:
supplying current from the first upper voltage rail to the ring oscillator comprises supplying current based on a data phase alignment signal, the frequency of the VCO clock signal varying with the data phase alignment signal; and
sinking current from the ring oscillator to the first lower supply voltage rail comprises sinking current from the ring oscillator based on the data phase alignment signal.

24. The method of claim 21, wherein:
the ring oscillator comprises a set of N cascaded inverters arranged to form a ring, wherein N is a positive integer number;
the at least one second upper voltage rail comprises a set of N/2 upper voltage rails;
the at least one second lower voltage rail comprises a set of N/2 lower voltage rails;
supplying current from the first upper voltage rail to the ring oscillator comprises supplying a first set of currents from the first upper voltage rail to pairs of the set of N cascaded inverters via the set of N/2 upper voltage rails based on a data phase alignment signal, respectively; and
sinking current from the ring oscillator to the first lower supply voltage rail comprises sinking a second set of currents from the pairs of the set of N cascaded inverters to the first lower supply voltage rail via the set of N/2 lower voltage rails based on the data phase alignment signal, respectively.

25. An apparatus for generating a voltage controlled oscillator (VCO) clock signal, comprising:
means for supplying current from a first upper voltage rail to a ring oscillator via at least one second upper voltage rail based on a frequency band select signal and a PLL frequency control signal, wherein the ring oscillator is configured to generate the VCO clock signal whose frequency varies with the frequency band select signal and the PLL frequency control signal; and
means for sinking current from the ring oscillator to a first lower supply voltage rail via at least one second lower voltage rail based on the frequency band select signal and the PLL frequency control signal.

26. The apparatus of claim 25, wherein:
the ring oscillator comprises a set of N cascaded inverters arranged to form a ring, wherein N is a positive integer number;
the at least one second upper voltage rail comprises a set of N upper voltage rails;
the at least one second lower voltage rail comprises a set of N lower voltage rails;
the means for supplying current from the first upper voltage rail to the ring oscillator comprises means for supplying a first set of currents from the first upper voltage rail to the set of N cascaded inverters via the set of N upper voltage rails, respectively; and
the means for sinking current from the ring oscillator to the first lower supply voltage rail comprises means for sinking a second set of currents from the set of N cascaded inverters to the first lower supply voltage rail via the set of N lower voltage rails, respectively.

27. The apparatus of claim 25, wherein:
the means for supplying current from the first upper voltage rail to the ring oscillator comprises means for supplying current based on a data phase alignment signal, the frequency of the VCO clock signal varying with the data phase alignment signal; and
the means for sinking current from the ring oscillator to the first lower supply voltage rail comprises means for sinking current from the ring oscillator based on the data phase alignment signal.

28. The apparatus of claim 25, wherein:
the ring oscillator comprises a set of N cascaded inverters arranged to form a ring;
the at least one second upper voltage rail comprises a set of N upper voltage rails;
the at least one second lower voltage rail comprises a set of N lower voltage rails;
the means for supplying current from the first upper voltage rail to the ring oscillator comprises means for supplying a first set of currents from the first upper voltage rail to the set of N cascaded inverters via the set of N upper voltage rails based on a data phase alignment signal, respectively; and
the means for sinking current from the ring oscillator to the first lower supply voltage rail comprises means for sinking a second set of currents from the set of N cascaded inverters to the first lower supply voltage rail via the set of N lower voltage rails based on the data phase alignment signal, respectively.

29. A wireless communication device, comprising:
at least one antenna;
a transceiver coupled to the at least one antenna;
an integrated circuit (IC) coupled to the transceiver, wherein the IC includes one or more signal processing cores, and wherein at least one of the IC or the transceiver each comprises:
a first upper voltage rail;
a first lower voltage rail; and
a voltage controlled oscillator (VCO), comprising:
at least one second upper voltage rail;
at least one second lower voltage rail;
a ring oscillator (RO) including a set of N cascaded inverters arranged in a ring, wherein the set of N cascaded inverters are coupled between the at least one second upper voltage rail and the at least one second lower voltage rail, wherein N is a positive integer number;
at least one first frequency band select circuit coupled between the first upper voltage rail and the at least one second upper voltage rail, respectively;
at least one second frequency band select circuit coupled between the at least one second lower voltage rail and the first lower voltage rail, respectively;
at least one first VCO frequency control circuit coupled between the first upper voltage rail and the at least one second upper voltage rail, respectively; and
at least one second VCO frequency control circuit coupled between the at least one second lower voltage rail and the first lower voltage rail, respectively.

30. The wireless communication device of claim 29, wherein the VCO further comprises:
at least one first data phase alignment circuit coupled between the first upper voltage rail and the at least one second upper voltage rail, respectively; and
at least one second data phase alignment circuit coupled between the at least one second lower voltage rail and the first lower voltage rail, respectively.

* * * * *